US012228991B2

(12) United States Patent
Laurent et al.

(10) Patent No.: US 12,228,991 B2
(45) Date of Patent: *Feb. 18, 2025

(54) ARCHITECTURE-BASED POWER MANAGEMENT FOR A MEMORY DEVICE

(71) Applicant: Lodestar Licensing Group, LLC, Evanston, IL (US)

(72) Inventors: Christophe Vincent Antoine Laurent, Agrate Brianza (IT); Andrea Martinelli, Bergamo (IT); Graziano Mirichigni, Vimercate (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,813

(22) Filed: Jul. 19, 2023

(65) Prior Publication Data
US 2024/0028099 A1 Jan. 25, 2024

Related U.S. Application Data

(63) Continuation of application No. 17/573,194, filed on Jan. 11, 2022, now Pat. No. 11,740,678, which is a (Continued)

(51) Int. Cl.
*G06F 1/32* (2019.01)
*G06F 1/3225* (2019.01)
(Continued)

(52) U.S. Cl.
CPC .......... *G06F 1/3225* (2013.01); *G06F 1/3275* (2013.01); *G06F 1/3287* (2013.01); *G06F 9/4401* (2013.01)

(58) Field of Classification Search
CPC .... G06F 1/3225; G06F 1/3275; G06F 1/3287; G06F 9/4401; G11C 5/144
See application file for complete search history.

(56) References Cited

U.S. PATENT DOCUMENTS 6,721,223 B2 4/2004 Matsumoto et al.
7,761,724 B2 7/2010 Rajan et al.
(Continued)

FOREIGN PATENT DOCUMENTS

JP 2002-373489 A 12/2002
JP 2004-038642 A 2/2004
(Continued)

OTHER PUBLICATIONS

Chinese Patent Office, "Notice of Allowance and Search Report", issued in connection with Chinese Patent Application No. 202080066534.8 dated Sep. 28, 2022 (4 pages).
(Continued)

*Primary Examiner* — Stefan Stoynov

(57) ABSTRACT

Methods, systems, and devices for architecture-based power management for a memory device are described. Aspects include operating a first memory bank within a memory device in a first mode and a second memory bank within the memory device in a second mode. The memory device may receive a power down command for the first memory bank while operating the first memory bank in the first mode and the second memory bank in the second mode and switch the first memory bank from the first mode to a first low power mode while maintaining the second memory bank in the second mode. The first low power mode corresponds to less power consumption by the first memory bank than the first mode. In some cases, switching the first memory bank from the first mode to the first low power mode includes deactivating circuitry dedicated to the first memory bank.

20 Claims, 11 Drawing Sheets

Related U.S. Application Data continuation of application No. 16/551,597, filed on Aug. 26, 2019, now Pat. No. 11,243,596.

(51) Int. Cl.
  *G06F 1/3234* (2019.01)
  *G06F 1/3287* (2019.01)
  *G06F 9/4401* (2018.01)

(56) References Cited

U.S. PATENT DOCUMENTS

| | | |
|---|---|---|
| 9,304,579 B2 | 4/2016 | Ware et al. |
| 9,570,118 B2 | 2/2017 | Lee et al. |
| 2002/0191467 A1 | 12/2002 | Matsumoto et al. |
| 2005/0125703 A1 | 6/2005 | Lefurgy et al. |
| 2010/0031075 A1 | 2/2010 | Kapil |
| 2010/0302893 A1 | 12/2010 | Sato et al. |
| 2014/0195837 A1 | 7/2014 | Park et al. |
| 2014/0298056 A1 | 10/2014 | Seki et al. |
| 2015/0287444 A1 | 10/2015 | Lee et al. |
| 2016/0246531 A1 | 8/2016 | Takizawa |
| 2016/0293264 A1 | 10/2016 | Al-Shamma et al. |
| 2017/0206031 A1 | 7/2017 | Yin |
| 2017/0285989 A1 | 10/2017 | Lai et al. |
| 2017/0293343 A1 | 10/2017 | Chinnakkonda Vidyapoornachary et al. |
| 2017/0344296 A1 | 11/2017 | Su et al. |
| 2018/0276149 A1 | 9/2018 | Bains |
| 2019/0237124 A1 | 8/2019 | Cha |
| 2019/0304530 A1 | 10/2019 | Choi |

FOREIGN PATENT DOCUMENTS

| | | |
|---|---|---|
| JP | 2010-277666 A | 12/2010 |
| JP | 2013-196740 A | 9/2013 |
| TW | 517234 B | 1/2003 |

OTHER PUBLICATIONS

International Search Report and Written Opinion received for PCT Patent Application No. PCT/US20/45412, mailed on Nov. 13, 2020, 15 pages.

IPO, "Office Action," issued in connection with ROC (Taiwan) Patent Application No. 109124406, dated Feb. 23, 2021 (3 pages).

Japan Patent Office, "Office Action," issued in connection with Japan Patent Application No. 2022513057 dated May 9, 2023 (7 pages) (4 pages of English Translation and 3 pages of Original Document).

Japan Patent Office, "Office Action," issued in connection with Japan Patent Application No. 2023-205805 dated Oct. 1, 2024 (8 pages) (4 pages of English Translation and 4 pages of Original Document).

ARCHITECTURE-BASED POWER MANAGEMENT FOR A MEMORY DEVICE

CROSS REFERENCE

The present application for patent is a continuation of U.S. patent application Ser. No. 17/573,194 by Laurent et al., entitled "ARCHITECTURE-BASED POWER MANAGEMENT FOR A MEMORY DEVICE," filed Jan. 11, 2022, which is a continuation of U.S. patent application Ser. No. 16/551,597 by Laurent et al., entitled "ARCHITECTURE-BASED POWER MANAGEMENT FOR A MEMORY DEVICE," filed Aug. 26, 2019, assigned to the assignee hereof, and is expressly incorporated by reference in its entirety herein.

BACKGROUND

The following relates generally to a system that includes at least one memory device and more specifically to architecture-based power management for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increase read/write speeds, increasing reliability, increasing data retention, reducing power consumption, or improving manufacturing processes, among other metrics. Solutions for improving power consumption at a memory device may be desired.

DETAILED DESCRIPTION

Figure 1:
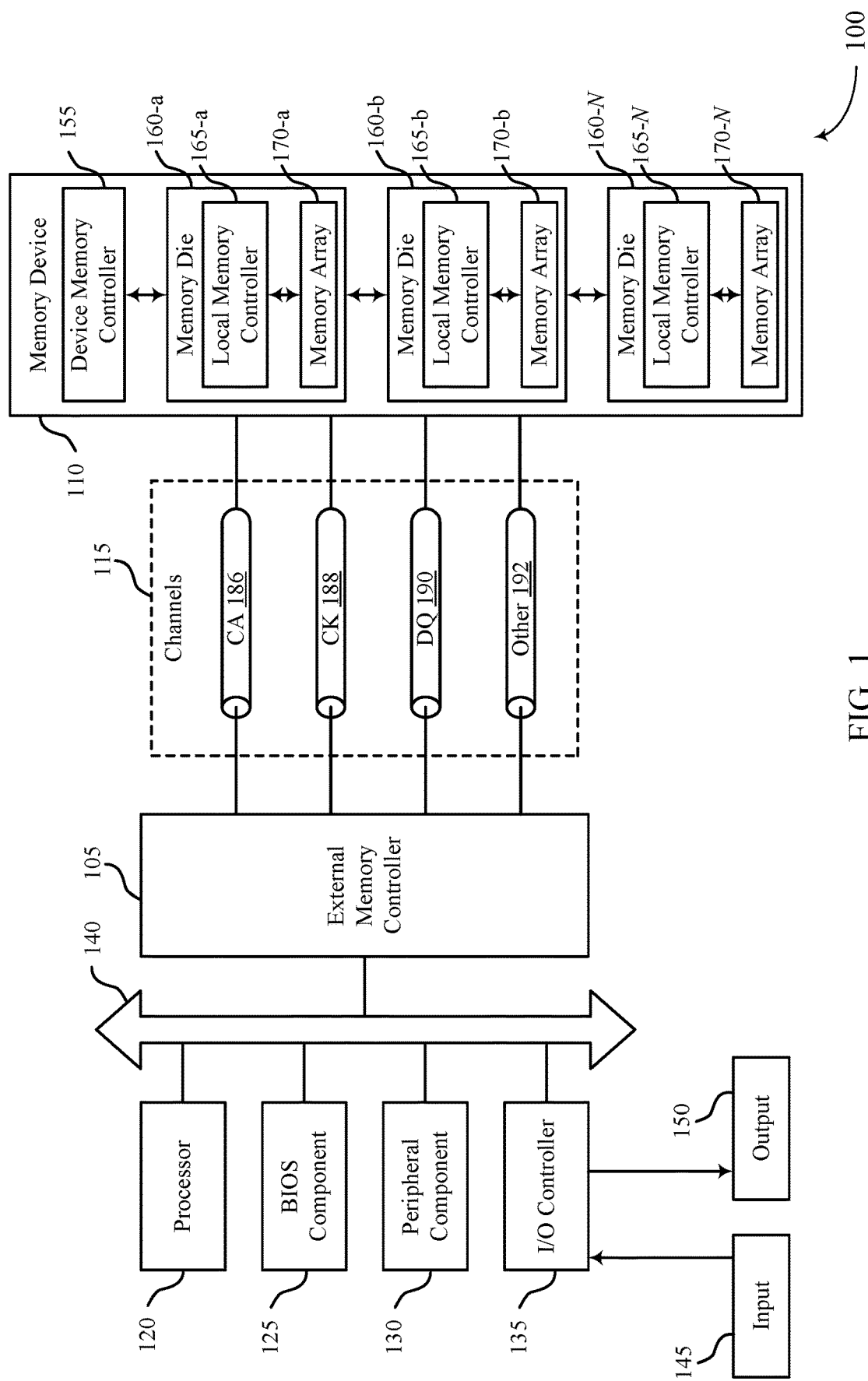
FIG. 1 illustrates an example of a system that supports architecture-based power management for a memory device in accordance with examples as disclosed herein.

Some memory devices may support one or more low power modes (alternatively, states) where the memory device may disable or change operation of one or more components (which may generically be referred to as circuitry) to reduce power consumption by the memory device. For example, a memory device may support an idle mode as well as a low power mode that has lower power consumption than the idle mode, and transitioning to the low power mode may include deactivating some amount of circuitry. In the low power mode, the memory device may not be able to perform access operations (e.g., read operations, write operations, etc.) on memory cells of the memory device or able to transition directly to an active mode in which such operations may be performed (e.g., when in the lower power mode, the memory device may have to first transition to the idle mode, then to the active mode). In some cases, a memory device may support different low power modes associated with different decreased levels of current consumption (e.g., associated with different amounts of deactivated circuitry).

For some memory devices, low power modes may operate and thus may be controlled a memory die level, meaning that each subblock (e.g., banks, bank groups, etc.) within the memory die may enter or exit the same low power mode together. Such memory devices thus may not support, for example, operating some subblocks of the memory die in a low power mode (e.g., with some or all of circuitry of the subblock deactivated) while operating one or more other subblocks of the memory die in the idle mode or the active mode to support access operations in the one or more other subblocks. Similarly, such memory devices may not support, as another example, operating some subblocks of the memory die in a first low power mode while operating one or more other subblocks of the memory die in a second low power mode, where the second low power mode may have greater power savings (e.g., a greater amount of deactivated circuitry) but a longer wakeup time. As a result, the memory die may only be switched into a low power mode if n expected time until a next access operation for the memory die is sufficiently long to accommodate the die-level wake up time and/or to counter any power consumption associated with transitioning the die into and out of the low power mode. Accordingly, a memory die may achieve less power savings than desired (e.g., the memory die may operate in a low power mode relatively infrequently due to the latency required to wake up the entire device or die).

As described herein, however, a memory device may achieve greater power savings (e.g., less overall or average current consumption) by operating different portions of the memory device or a die therein (e.g., different portions of a single memory array) in different power modes. In some cases, a memory device may operate different portions of the device in different low power modes based on the architecture of the memory device, where the different portions of the memory device may be assigned to different hierarchical levels based on the memory device architecture. For example, circuitry at a die hierarchical level may be shared by (common to) all memory subblocks (e.g., banks or groups of banks (which may be referred to as bank groups)) within a memory die. As another example, circuitry at a bank hierarchical level may be specific (dedicated) to one memory bank within the memory die, and which may be independent of (not shared by) any other banks within the memory die. And as another example, circuitry at a group hierarchical level may be shared by (e.g., accessible by, used by, coupled or couplable with) multiple memory banks (which may be referred to as a bank group) but not by all memory banks within the memory die—that is, circuitry at the group hierarchical level may be shared by all banks within the bank group but may be independent of (not shared by) any other banks within the memory die. A memory die may include any number of memory banks and bank groups.

Thus, a memory device architecture may be divided into different levels of hierarchy based on functional dependencies or shared circuitry among aspects of the memory device. If entities at one hierarchical level share some circuitry or have some other functional dependency, then that shared circuitry or functional dependency may be assigned another, higher hierarchical level. It is thus to be understood that, while some examples may be described herein in terms of hierarchical levels that include a bank level, group level, and die level, any number of hierarchical levels may be defined (e.g., based on entities for which some circuitry or other component is common), including at the sub-bank level, at the supra-die level, or at any intermediate level. It is also to be understood that, while some examples may be described herein based on FeRAM or DRAM devices and architectures, the teachings herein may be applied to any type of memory device and related architecture.

Different entities of a memory device that are at a same hierarchical level (e.g., different dies, different bank groups, different banks) may be switched into and out of low power modes independently of one other. Thus, one entity at the hierarchical level may be in one low power mode while another entity at the same hierarchical level is in another low power mode or some other operating mode (e.g., idle or active). Additionally or alternatively, different entities at a same hierarchical level but within a same hierarchical grouping at that level (e.g., banks within a same bank group, bank groups within a same die) may be switched into and out of low power modes together (collectively). These and other changes in operating mode may be accomplished, for example, through power mode commands that are specific to a hierarchical level and to a hierarchical grouping within that hierarchical level (e.g., specific to one bank, specific to one bank group, specific to one die). As described herein, one or more registers may be used to store state information or other information in support of operating the memory device according to such power mode commands.

In some cases, a memory device may automatically power down some or all circuitry at a higher hierarchical level if all entities at a lower hierarchical level are operating in a low power mode. For example, if all banks in a bank group have been switched into a low power mode via bank-specific power down commands, the memory device may automatically deactivate some or all group level circuitry for the bank group). In some cases, a memory device may also support switching aspects of a memory device from one low power mode to another low power mode, or switching from having only entities at a lower hierarchical level in a low power mode to also having at least one higher level entity in a low power mode (which may be considered a higher level low power mode), without passing through an intermediate (e.g., idle) state.

By operating different aspects of a memory device independently of one another as described herein, enhanced power savings may be achieved, among other benefits that may be appreciated by one or ordinary skill in the art. For example, different aspects of the memory device may be placed into a low power mode (or a deeper low power mode) more often, as greater flexibility may be provided to more frequently place an aspect of the memory device into the deepest low power mode possible based on usage patterns for different aspects of the memory device. As one example, data associated with (e.g., accessed by) a same application may be stored in a same bank or bank group, such that when the application is active or expected to be active within some threshold amount of time, other banks or bank groups may be in a low power mode (or deeper low power mode), while the associated bank or bank group may be in an idle mode (or less deep low power mode).

Figure 2:
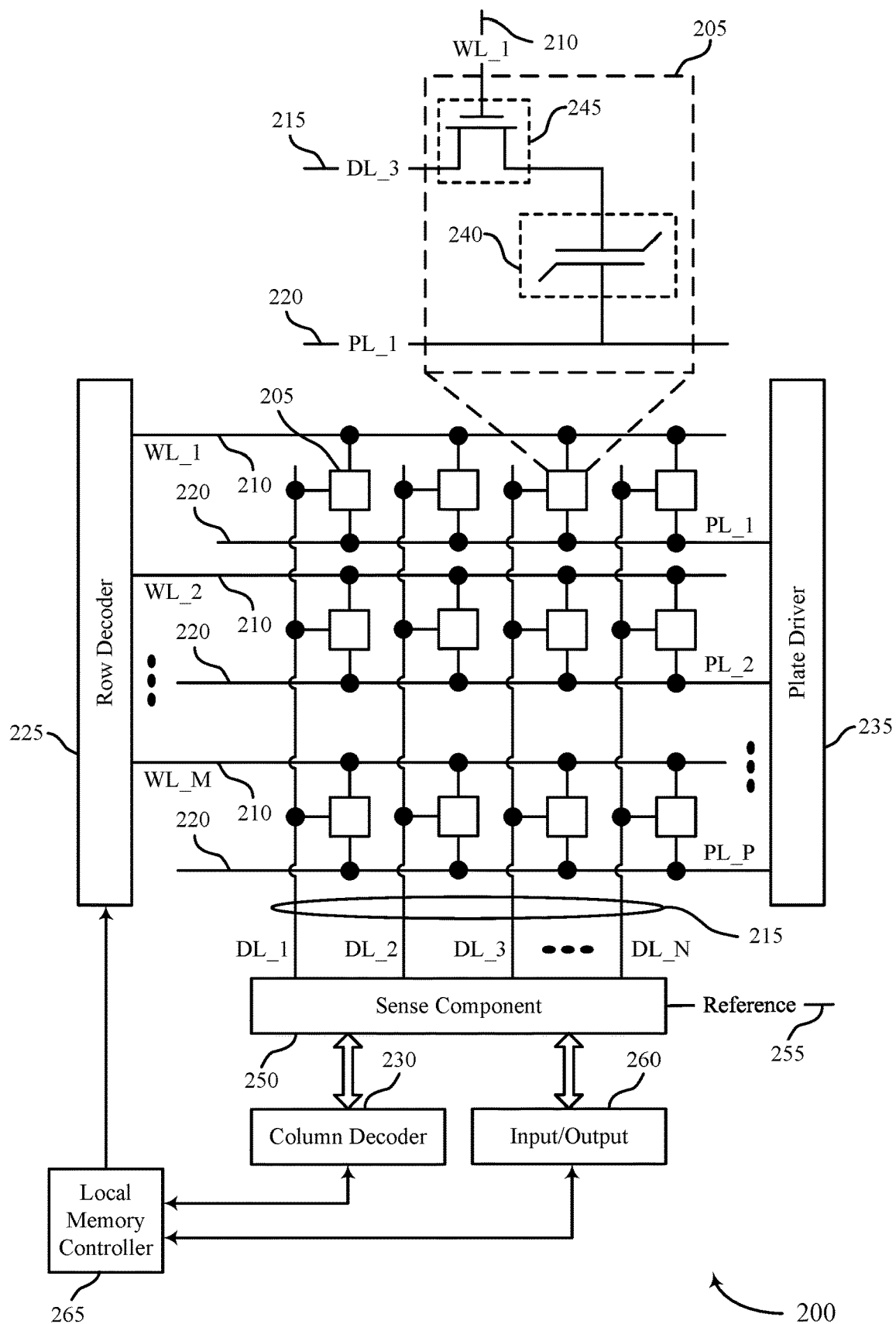
FIG. 2 illustrates an example of a memory die that supports architecture-based power management for a memory device in accordance with examples as disclosed herein.

These and other features of the disclosure are initially described in the context of a memory system and memory die with reference to FIGS. 1-2. Features of the disclosure are then described in the context of an example memory die architecture and related state diagrams with reference to FIGS. 3-6. These and other features of the disclosure are further illustrated by and described in the context of an apparatus diagram and flowcharts related to architecture-based power management for a memory device with references to FIGS. 7-11.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dies 160 (e.g., memory chips) to support a desired or specified capacity for data storage. The memory device 110 including two or more memory dies may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The memory device 110 may include a device memory controller 155 and one or more memory dies 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dies 160 (e.g., memory die 160-a, memory die 160-b, and/or any quantity of memory dies 160-N). In a 3D memory device, a plurality of memory dies 160-N may be stacked on top of one another or next to one another. In some cases, memory dies 160-N in a 3D memory device may be referred to as decks, levels, layers, or dies. A 3D memory device may include any quantity of stacked memory dies 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dies 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dies 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

Aspects of the memory device 110 may be assigned or otherwise considered to be at different hierarchical levels (e.g., a die level, a group level, a bank level, or otherwise). Based on one or more commands, the memory device 110 may switch different aspects of the memory device 110 into or out of a low power mode either collectively or independently from one another. For example, the memory device 110 may receive a command to switch a memory bank into a low power mode, and the memory device may deactivate circuitry dedicated to that memory bank. As another example, the memory device 110 may receive a command to switch a bank group from a first mode (e.g., idle mode) to a low power mode, and the memory device 110 may deactivate group level circuitry dedicated to that bank group (shared by all memory banks within the bank group) along with bank level circuitry dedicated to the individual memory banks within the bank group. As yet another example, the memory device 110 may receive a command to switch a memory die 160 from a first mode (e.g., idle mode) to a low power mode, and the memory device 110 may deactivate die level circuitry shared by all memory banks (and thus by all bank groups) within that memory die 160 along with the group level circuitry for each bank group and the bank level circuitry for each memory bank within the memory die 160. Thus, with respect to power down commands for an indicated entity at an indicated hierarchical level (which may alternatively be referred to as enter commands for a low power mode), the memory device 110 may deactivate circuitry at the indicated hierarchical level for the indicated entity (e.g., may deactivate group level circuitry for the indicated bank group), and also may deactivate circuitry at any lower hierarchical level for entities within the indicated entity (e.g., may deactivate bank level circuitry for banks within the indicated bank group).

Similarly, with respect to power up some commands for an indicated entity at an indicated hierarchical level (which may alternatively be referred to as exit commands for a low power mode), the memory device 110 may activate circuitry at the indicated hierarchical level for the indicated entity (e.g., may activate group level circuitry for the indicated bank group), and also may activate circuitry at any lower hierarchical level for entities within the indicated entity (e.g., may activate bank level circuitry for banks within the indicated bank group).

Additionally or alternatively, the memory device may receive cancellation commands (which may alternatively be referred to as remove commands) with respect to a prior power down command for an indicated entity at an indicated hierarchical level, in which case the memory device 110 may restore the indicated entity along with any lower hierarchical level for entities within the indicated entity to their respective modes of operation at the time the prior power down command was received.

In some cases, the memory device 110 may track whether lower level entities (e.g., banks or bank groups) are operating in one or more low power modes and may automatically deactivate circuitry at a higher hierarchical level (e.g., group level circuitry or die level circuitry) if all of the lower level entities within a higher level entity are individually operating in a low power mode. For example, the memory device 110 may determine that all the memory banks of a first bank group are operating in a low power mode, and the memory device 110 may deactivate group level circuitry for the first bank group. As another example, the memory device 110 may determine that all of the memory banks (or bank groups) of a first memory die 160 are operating in a low power mode, and the memory device 110 may deactivate group level circuitry (if not already deactivated) along with die level circuitry for the first memory die 160. In some cases, the memory device 110 may further track whether an entity has been placed into a low power mode by way of an automatic or commanded transition, and in response to a cancellation command for a prior power down command, the memory device 110 may reverse (unwind, undo, cancel) only commanded transitions—that is, if an entity within the scope of the cancellation command is in a low power mode as a result of an automatic transition, the memory device 110 may ignore the cancellation command with respect to that entity.

FIG. 2 illustrates an example of a memory die 200 in accordance with examples as disclosed herein. The memory die 200 may be an example of the memory dies 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
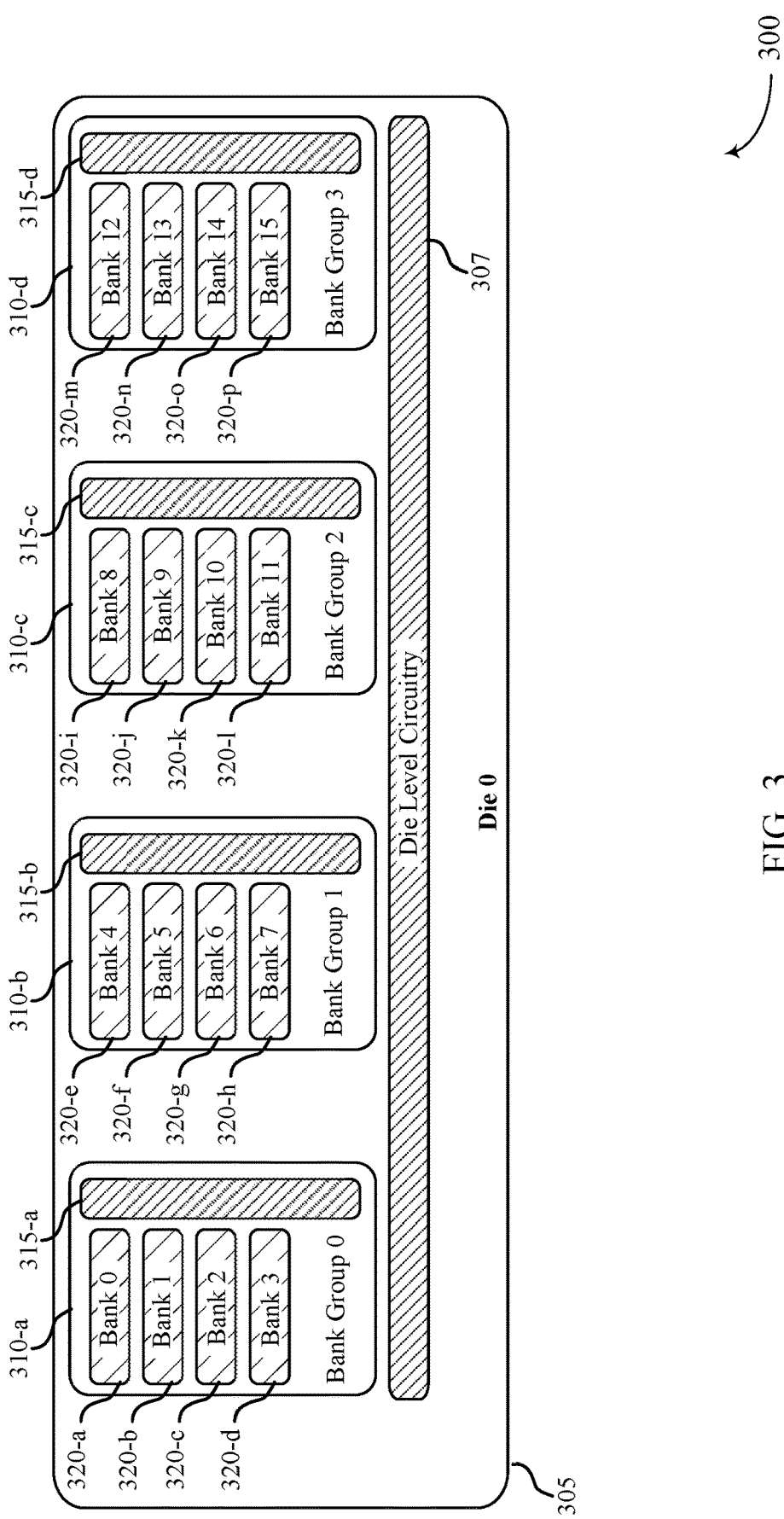
FIG. 3 illustrates an example of a memory die system that supports architecture-based power management for a memory device in accordance with examples as disclosed herein.

Different entities within the memory die 200 may be organized according to an architecture that includes different hierarchical levels, as described herein, including with reference to FIG. 3. Further, a memory device 110 that includes the memory die 200 may operate the different entities according to different power mode commands (e.g., power down commands, power up commands, cancellation commands) and related power mode information (e.g., state information related to operating modes or automatic transitions) as described herein.

FIG. 3 illustrates an example of a memory die architecture 300 that supports architecture-based power management for a memory device in accordance with examples as disclosed herein. Only memory die 305 is shown, but it is to be understood that a memory device may include any number of memory dies 305, which may be operated independently or collectively based on any higher hierarchical level, in accordance with the teachings herein. The memory dies 305 may be an example of a memory die 160, 200 as described with reference to FIGS. 1 and 2.

The memory die 305 may be organized according to a hierarchical architecture that includes multiple hierarchical levels. The hierarchical levels may be based on functional dependencies and shared circuitry of different components.

An example of a first hierarchical level may be a bank level. Each memory bank 320 may include, be coupled with, or otherwise be associated with dedicated circuitry for operating the memory bank 320 (e.g., for performing access operations on the memory bank 320), and circuitry that is not common to (shared by) any two memory banks 320 may be referred to as bank level circuitry.

An example of a second hierarchical level may be a group level, which may be considered a higher hierarchical level than the bank level. For example, some circuitry may be shared by multiple memory banks 320 (e.g., to conserve area within the memory die 305). Circuitry that is shared by two or more memory banks 320 but not by all memory banks 320 within the memory die 305 may be referred to as group level circuitry, and memory banks 320 that share a same set of group level circuitry 315 may be referred to as a bank group 310. Circuitry in a set of group level circuitry 315 may be coupled or couplable (e.g., selectively) with all memory banks 320 within the respective bank group 310. For example, circuitry in the set of bank group circuitry 315-a may be coupled with each of memory banks 0-3, or may be selectively couplable with any one or more of memory banks 0-3. Examples of group level circuitry may include charge pumps or error correcting code (ECC) components.

An example of a third hierarchical level may be a die level, which may be considered a higher hierarchical level than the group level. For example, some circuitry may be shared by all memory banks 320 (and thus all bank groups 310) within the memory die 305. Circuitry that is shared by all memory banks 320 within the memory die 305 may be referred to as die level circuitry. Thus, each memory die 305 may include a set of die level circuitry 307. Examples of die level circuitry may include fuse arrays or command decoders (e.g., for user commands).

Other hierarchical levels—such as levels higher than die level (e.g., for a multi-die device), lower than bank level (e.g., for portions of a memory bank 320), or in between—may exist, but examples herein may be described in terms of the bank level, group level, and die level for illustrative clarity, as these may serve as example low, intermediate, and high hierarchical levels. In general, any circuitry that is shared by entities at a first hierarchical level may be considered to be at a second hierarchical level that is higher than the first hierarchical level.

When a memory bank 320 is operating in the idle mode, the dedicated circuitry for the memory bank 320 may consume a first amount of power. For example, in the idle mode, the memory bank 320 may maintain certain aspects of the memory bank 320 (e.g., access line drivers, access line decoders, sense components, or the like) in a prepared (e.g., precharged) state such that these components are ready to perform access operations on memory cells of the memory bank 320 should an activate (ACT) command subsequently be received for the memory bank 320 (in which case the memory device may switch the memory bank 320 into the active mode, which may correspond to a second, greater amount of power consumption). Accordingly, when operating in the idle mode, the dedicated bank level circuitry for the memory bank 320 may draw a first amount of current and thus consume the first amount of power.

Memory banks 320 may also support one or more bank level low power modes that decrease current consumption at a memory bank 320. In some cases, a memory device (e.g., a memory controller, such as an external memory controller 105, device memory controller 155, or local memory controller 165) may switch a memory bank 320 into and out of one or more bank level low power modes independent of the operating modes of other memory banks 320. A bank level low power mode may be any operating mode in which the amount of current and thus power consumption by the memory bank 320 is lower than when the memory bank is in the idle mode. Switching a memory bank 320 into a bank level low power mode may include deactivating or powering down one or more components of the dedicated circuitry for the memory bank 320. Switching a memory bank 320 out of a bank level low power mode into a target mode (e.g., an idle mode, a less deep low power mode) may include activating some or all bank level circuitry for the memory bank 320 that is not already activated.

Where multiple low power modes are supported for a memory bank 320, each of the bank level low power modes may correspond to a different amount of deactivated circuitry or otherwise to a different amount of current and power consumption for the memory bank 320. For example, switching a memory bank 320 into a first bank level low power mode may include deactivating a first amount of the bank level circuitry for the memory bank 320, and switching the memory bank 320 into a second bank level low power mode may include deactivating a greater amount of the bank level circuitry for the memory bank 320. The second bank level low power mode may be referred to as a deeper low power mode than the first bank level low power mode. Any number of bank level low power modes may be supported for a memory bank 320, each corresponding to a progressively greater amount of deactivated bank level circuitry for the memory bank 320, and each corresponding to progressively less power consumption for the memory bank 320. In some cases, each low power mode may also correspond to a progressively greater amount of time for the memory bank 320 to exit the low power mode and switch into an idle mode, which may be referred to as a wakeup or exit time.

At the group level, when at least one memory bank 320 of a bank group 310 is operating in an idle mode, active mode, or other non-low-power mode, the corresponding set of group level circuitry 315 may be activated and thus consuming associated amounts of current and power to support operations for the memory bank 320. Bank groups 310 may also support any number of group level low power modes, however, where switching the bank group 310 into the group level low power mode may include deactivating a corresponding amount (e.g., some or all) of circuitry within the corresponding set of group level circuitry 315. Thus, where multiple group level low power modes are supported, each may correspond to a progressively greater amount of deactivated group level circuitry for the corresponding set of group level circuitry 315, and each may correspond to progressively less power consumption for the bank group 310, in like fashion as described with respect to multiple bank level low power modes. In some cases, switching a bank group 310 into a group level low power mode may include—along with deactivating some amount of group level circuitry 315—switching all memory banks 320 within the bank group 310 into a bank level low power mode (e.g., the deepest bank level low power mode supported by the memory banks 320), if the corresponding memory banks 320 are not already each in a bank level low power mode. In some cases, switching a bank group 310 out of a group level low power mode may include—along with deactivating some amount of group level circuitry 315—switching all memory banks 320 within the bank group 310 into the idle mode.

At the die level, when at least one memory bank 320 (and thus at least one bank group 310) of a memory die 305 is operating in an idle mode, active mode, or other non-low-power mode, the corresponding set of die level circuitry 307 may be activated and thus consuming associated amounts of current and power to support operations for the one or more memory banks 320. Similar to as described for the bank level and group level, however, a set of die level circuitry may support any number of die level low power modes. Switching the memory die 305 into the die level low power mode may include deactivating a corresponding amount (e.g., some or all) of circuitry within the corresponding set of die level circuitry 307. Thus, where multiple die level low power modes are supported, each may correspond to a progressively greater amount of deactivated die level circuitry for the memory die 305, and each may correspond to progressively less power consumption for the memory die 305, in like fashion as described with respect to multiple bank level low power modes. In some cases, switching a memory die 305 into a die level low power mode may include—along with deactivating some amount of die level circuitry 307—switching all bank groups 310 within the memory die 305 into a group level low power mode (e.g., the deepest group level low power mode supported by the bank groups 310), and thus also switching all memory banks 320 within the memory die 305 into a bank level low power mode (e.g., the deepest bank level low power mode supported by the memory banks 320), if the bank groups 310 and memory banks 320 are not already each in such low power modes. In some cases, switching a memory die 305 out of a die level low power mode may include—along with deactivating some amount of die level circuitry 307—switching all memory banks 320 within the memory die 305 into the idle mode, and activating all sets of group level circuitry 315 within the memory die 305.

Figure 4:
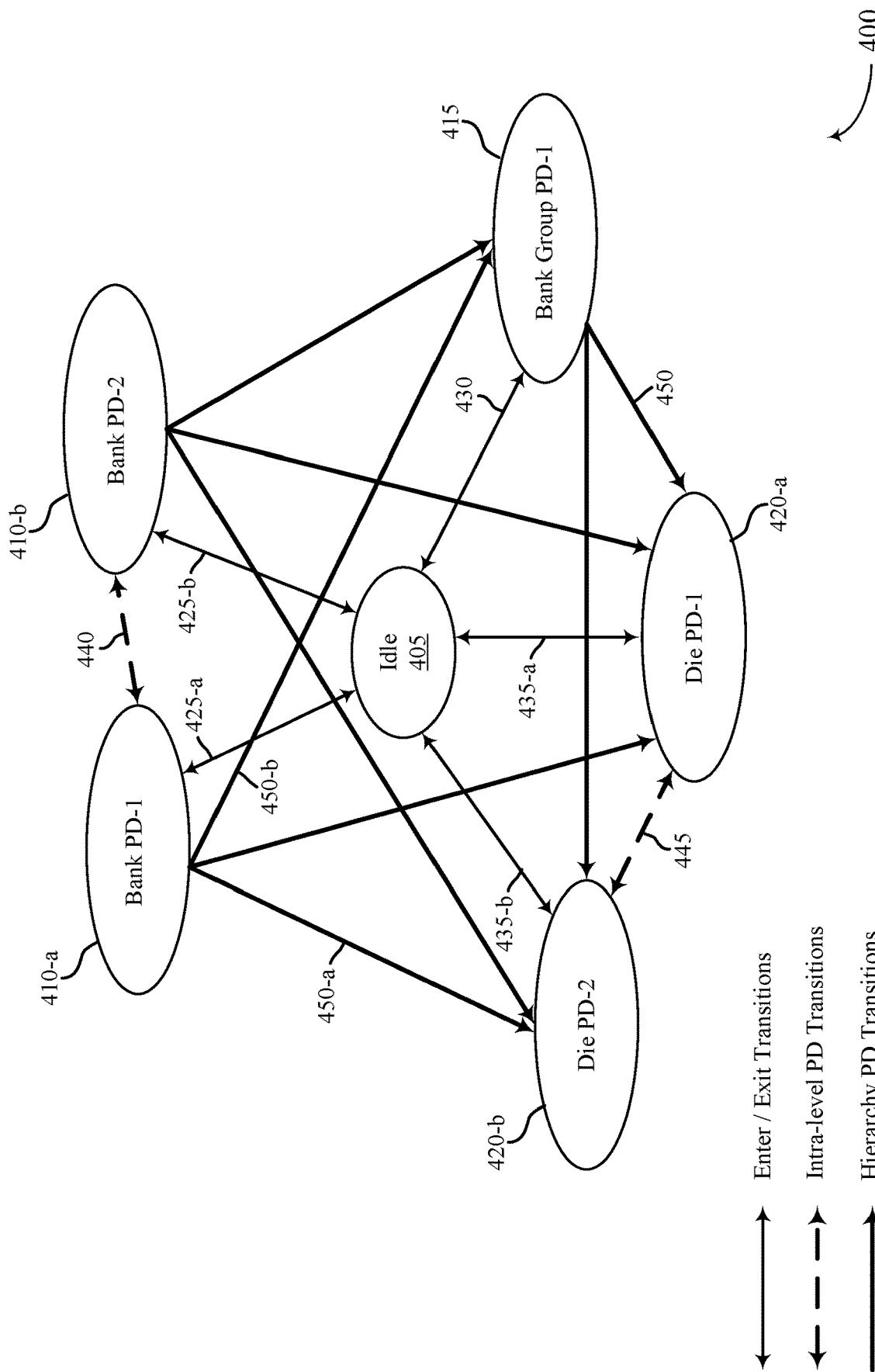
FIG. 4 illustrates an example of a state diagram that supports architecture-based power management for a memory device in accordance with examples as disclosed herein.

FIG. 4 illustrates an example of a state diagram 400 that supports architecture-based power management for a memory device in accordance with examples as disclosed herein. Aspects of the state diagram 400 may be implemented by the memory device 110, memory die 160, memory die 200 or memory die architecture 300 described with reference to FIGS. 1-3. The state diagram 400 illustrates examples of how portions of a memory device (e.g., memory banks, bank groups, a memory die, or the like) may switch between different operating modes, including an idle mode 405 and one or more low power modes. In some cases, the transitions between operating modes shown in the state diagram 400 may occur in response to one or more commands that may be received by the memory device.

A memory device may be configured to independently switch an entity at a given hierarchical level into and out of different operating modes for the hierarchical level without necessarily impacting the operating mode of other entities at the same hierarchical level. For example, the memory device may be configured to (i) switch a memory bank 320 into and out of different operating modes without impacting the operating mode of other memory banks 320, (ii) switch a bank group 310 into and out of different operating modes without impacting the operating mode of other bank groups 310, and (iii) switch a memory die 305 into and out of different operating modes without impacting the operating mode of other memory dies 305 (in a multi-die device).

As depicted in FIG. 4, the idle mode 405 may broadly represent an idle mode that is applicable to any number of hierarchical levels. When a memory bank 320 is in the idle mode 405, the bank level circuitry subject to deactivation in one or more bank level low power modes 410 may be activated. When a bank group 310 is in the idle mode 405, the group level circuitry subject to deactivation in one or more group level low power modes 415 may be activated. When a memory die is in the idle mode 405, the die level circuitry subject to deactivation in one or more die level low power modes 420 may be activated.

Transitions 425 may represent transitions for a memory bank 320 between the idle mode 405 and a bank level low power mode 410. In some cases, transitions 425 may occur in response to power down commands and power up commands (which may alternatively be referred to as enter and exit commands) specific to a target memory bank 320. For example, a bank level power down command may be denoted as an EnterPowerDownYBankX command, where X may be an index, address, or other identifier of the target memory bank 320, and where Y may be an index or other identifier of the target bank level low power mode. Thus, Y may be unnecessary where only one bank level low power mode is supported.

In response to an EnterPowerDownYBankX command, the memory device may switch memory bank 320 X into bank level low power mode Y (e.g., by deactivating some or all of the corresponding bank level circuitry or by otherwise reducing power consumption by the memory bank 320 X) without altering the operating mode of any other memory bank 320, or of any set of group level circuitry 315 or die level circuitry 307.

Similarly, a bank level power up command may be denoted as an ExitPowerDownBankX command. In response to an ExitPowerDownBankX command, the memory device may switch memory bank 320 X into the idle mode 405 (e.g., by activating some or all of the corresponding bank level circuitry or by otherwise increasing power consumption by the memory bank 320 X) without altering the operating mode of any other memory bank 320.

If the bank group 310 that includes memory bank 320 X is in a group level low power mode, the memory device may also switch the bank group 310 into the idle mode 405 (e.g., by activating the corresponding set of group level circuitry 315) in response to the ExitPowerDownBankX command, but the memory device may not alter the operating mode of any other bank group 310. Similarly, if the memory die 305 that includes memory bank X is in a die level low power mode, the memory device may also switch the memory die 305 into the idle mode 405 (e.g., by activating the corresponding set of die level circuitry 307) in response to the ExitPowerDownBankX command, but the memory device may not alter the operating mode of any other memory die 305. If the bank group 310 or memory die 305 that includes memory bank 320 X is already in the idle mode 405, the memory device may not alter the operating mode of the bank group 310 or memory die 305 in response to the ExitPowerDownBankX command.

The example of FIG. 4 illustrates two bank level low power modes 410 (Bank PD-1 (Y=1) and Bank PD-2 (Y=2)). While operating in the first bank level low power mode 410-a, a memory bank 320 may consume less power than when operating in the idle mode 405. While operating in the second bank level low power mode 410-b, the memory bank 320 may consume less power (e.g., more bank level circuitry may be deactivated) than when operating in the first bank level low power mode 410-a. Though two bank level low power modes are illustrated in FIG. 4, it is to be understood that any number of bank level low power modes are possible.

Transitions 430 may represent transitions for a bank group 310 between the idle mode 405 and a group level low power mode 415. In some cases, transitions 430 may occur in response to power down commands and power up commands specific to a target bank group 310. For example, a group level power down command may be denoted as an EnterPowerDownYBankGroupX command, where X may be an index, address, or other identifier of the target bank group 310, and where Y may be an index or other identifier of the target group level low power mode. Thus, Y may be unnecessary where only one group level low power mode is supported.

In response to an EnterPowerDownYBankGroupX command, the memory device may switch bank group 310 X into group level low power mode Y (e.g., by deactivating some or all of the set of group level circuitry 315 or by otherwise reducing power consumption by the corresponding set of group level circuitry 315) without altering the operating mode of any other bank group 310, or of any die level circuitry 307.

If any memory bank 320 within bank group 310 X is not already in a bank level low power mode, the memory device may switch such memory bank 320 into the bank level low power mode (e.g., the deepest supported bank level low power mode) in response to the EnterPowerDownYBankGroupX command. Thus, in response to the EnterPowerDownYBankGroupX command, one or more memory banks 320 within bank group 310 X may be switched out of the idle mode 405 or out of a less deep bank level low power mode (e.g., from Bank PD-1 to Bank PD-2).

Similarly, a bank level power up command may be denoted as an ExitPowerDownBankGroupX command. In response to an ExitPowerDownBankGroupX command, the memory device may switch bank group 310 X into the idle mode 405 (e.g., by activating some or all of the corresponding set of group level circuitry 315 or by otherwise increasing power consumption by the corresponding set of group level circuitry 315) without altering the operating mode of any other bank group 310. The memory device may also switch all memory banks 320 included in bank group 310 X into the idle mode 405.

If the memory die 305 that includes memory bank X is in a die level low power mode, the memory device may switch the memory die 305 into the idle mode 405 as well (e.g., by activating the corresponding set of die level circuitry 307) in response to the ExitPowerDownBankX command, but the memory device may not alter the operating mode of any other memory die 305. If the memory die 305 that includes memory bank 320 X is already in the idle mode 405, the memory device may not alter the operating mode of the memory die 305 in response to the ExitPowerDownBankX command.

The example of FIG. 4 illustrates one group level low power mode 415 (Bank Group PD-1 (Y=1)). While operating in the group level low power mode 415, a bank group 310 may consume less power than when operating in the idle mode 405. Though one group level low power mode is illustrated in FIG. 4, it is to be understood that any number of group level low power modes are possible.

Transitions 435 may represent transitions for a memory die 305 between an idle mode 405 and a die level low power mode 420. In some cases, transitions 435 may occur in response to power down commands and power up commands specific to a target memory die 305. For example, a die level power down command may be denoted as an EnterPowerDownYDieX command, where X may be an index, address, or other identifier of the target memory die 305, and where Y may be an index or other identifier of the target die level low power mode. Thus, X may be unnecessary where the memory device includes only one memory die 305, and Y may be unnecessary where only one group level low power mode is supported.

In response to an EnterPowerDownYDieX command, the memory device may switch memory die 305 X into die level low power mode Y (e.g., by deactivating some or all of the set of die level circuitry 307 or by otherwise reducing power consumption by the corresponding set of die level circuitry 307) without altering the operating mode of any other memory die 305.

If any memory bank 320 or bank group 310 within memory die 305 X is not already in a bank level or group level low power mode associated with the die level low power mode Y, the memory device may switch such memory bank 320 or bank group 310 into the associated bank level or group level low power mode (e.g., the deepest supported bank level or group level low power mode) in response to the EnterPowerDownYDieX command. Thus, one or more memory banks 320 or bank groups 310 within memory die 305 X may be switched out of the idle mode 405 or out of a less deep bank level or group level low power mode in response to the EnterPowerDownYDieX command.

Similarly, a die level power up command may be denoted as an ExitPowerDownDieX command. In response to an ExitPowerDownDieX command, the memory device may switch memory die 305 X into the idle mode 405 (e.g., by activating some or all of the corresponding set of die level circuitry 307 or by otherwise increasing power consumption by the corresponding set of die level circuitry 307) without altering the operating mode of any other memory die 305. The memory device may also switch all memory banks 320 (and thus all bank groups 310) included in memory die 305 X into the idle mode 405.

The example of FIG. 4 illustrates two die level low power modes 420 (Die PD-1 (Y=1) and Die PD-2 (Y=2)). While operating in the first die level low power mode 420-a, a memory die 305 may consume less power than when operating in the idle mode 405. While operating in the second die level low power mode 420-b, the memory die 305 may consume less power (e.g., more die level circuitry may be deactivated) than when operating in the first die level low power mode 420-a. Though two die level low power modes are illustrated in FIG. 4, it is to be understood that any number of die level low power modes are possible.

Thus, in general, a command to power down an entity at a lower hierarchical level may not impact other entities at that lower hierarchical level or other entities at higher hierarchical levels. And a command to power up an entity at a lower hierarchical level similarly may not impact other entities at that lower hierarchical level, but it may cause entities at higher hierarchical levels to be activated (e.g., placed into an idle mode 405) if not already activated.

Also, in general, a command to power down an entity at a higher hierarchical level may not impact other entities at that higher hierarchical level, but it may cause entities at lower hierarchical levels to be deactivated (e.g., placed into a corresponding low power mode). And a command to power up an entity at a higher hierarchical level may not impact other entities at that higher hierarchical level, but it may cause entities at lower hierarchical levels to be activated (e.g., placed into an idle mode 405).

In some cases, the memory device may support switching an entity at a hierarchical level directly between different low power modes (e.g., from a less deep low power mode to a deeper low power mode, or vice versa) for that hierarchical level, where switching directly between the modes means without the entity or any lower level entities therein going into the idle mode 405 as part of the transition. Such intra-level changes in power mode may be referred to as intra-level power down change commands.

For example, the memory device may switch a memory bank 320 from the first bank level low power mode 410-*a* to the second bank level low power mode 410-*b* (or vice versa) in response to an intra-bank-level power down change command 440, where the intra-bank-level power down change command 440 may include an indication of the memory bank 320 and the target bank level low power mode 410. As another example, the memory device may switch a bank group 310 from a first group level low power mode 415 to a second group level low power mode 415 (not shown in FIG. 4) (or vice versa) in response to an intra-group-level power down change command, where the intra-group-level power down change command may include an indication of the bank group 310 and the target group level low power mode 415. As yet another example, the memory device may switch a memory die 305 from the first die level low power mode 420-*a* to the second die level low power mode 420-*b* (or vice versa) in response to an intra-die-level power down change command 445, where the intra-die-level power down change command 445 may include an indication of the memory die 305 and the target die level low power mode 420.

When switching an entity at a hierarchical level directly between different low power modes for that hierarchical level, other entities at the same hierarchical level as well as entities at other hierarchical levels may not be impacted and may remain in their respective operating modes. For example, when switching a memory bank 320 between different bank level low power modes 410, there may be no impact on the operating mode of other memory banks 320 or on the operating mode of bank groups 310 or memory dies 305.

In some cases, the memory device may also support switching from having only entities at a lower hierarchical level in a corresponding low power mode to also having at least one higher level entity in a corresponding low power mode—which may be considered as switching the memory device from a lower hierarchical level low power mode to a higher hierarchical level low power mode—without passing through an intermediate (e.g., idle) state.

Transitions 450 may represent transitions for a memory device directly (e.g., without going into the idle mode 405 as part of the transition) between lower hierarchical level low power modes to higher hierarchical level low power modes. A transition 450 may occur in response to a power down command associated with the higher hierarchical level. For example, as described above, in response to an EnterPowerDownYBankGroupX command, not only may circuitry at the group level (e.g., the set of group level circuitry 315 corresponding to the indicated bank group 310) be powered down (e.g., at least partially deactivated), but memory banks 320 within the bank group 310 may also change operating mode (e.g., switch to the deepest supported bank level power mode). Similarly, as also described above, in response to an EnterPowerDownYDieX command, not only may circuitry at the die level (e.g., the set of die level circuitry 307 corresponding to the indicated memory die 305) be powered down (e.g., at least partially deactivated), but memory banks 320 and bank groups 310 within the memory die 305 may also change operating mode (e.g., switch to the deepest supported bank level and group level power modes).

Figure 5:
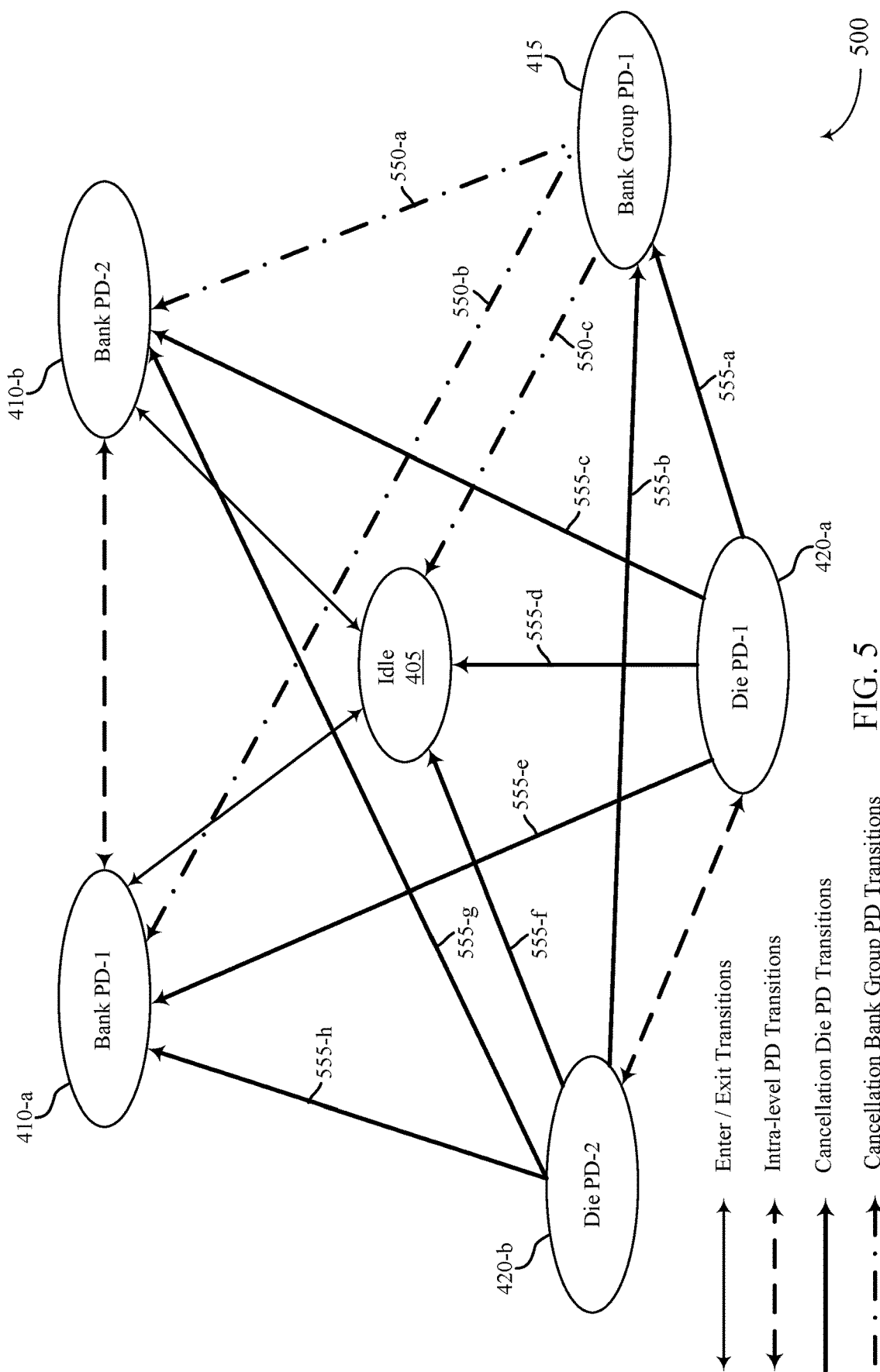
FIG. 5 illustrates an example of a state diagram that supports architecture-based power management for a memory device in accordance with examples as disclosed herein.

FIG. 5 illustrates another example of a state diagram 500 that supports architecture-based power management for a memory device in accordance with examples as disclosed herein. State diagram 500 may correspond to state diagram 400, but with transitions 430, 435, 450 not illustrated so that other types of transitions may be illustrated without loss of visual clarity. It is to be understood that some or all aspects of state diagrams 400 and 500 may be combined in any combination in accordance with the teachings herein.

For example, state diagram 500 includes transitions 550 and 555, which may represent transitions in response to cancellation commands (which may alternatively be referred to as remove commands). A cancellation command may be associated with (e.g., include an indication of) a target entity within the memory device (e.g., a bank group 310). In response to the cancellation command, the memory device may switch the target entity into the idle mode 405 (e.g., may activate circuitry for the target entity) and may switch any lower level entities within that entity to their respective operating modes as of the time the most recent power down command for the target entity was received. For example, in response to a cancellation command for a bank group 310, the memory device may activate the set of group level circuitry 315 for the bank group 310 and may restore each memory bank 320 of the bank group 310 to its respective operating mode as of the time the most recent EnterPowerDownYBankGroupX command was received for the bank group 310. Thus, whereas a power up command for a higher hierarchical level entity may cause each lower level entity therein to transition into the idle mode 405, a cancellation command for a higher hierarchical level entity may cause each lower level entity therein to transition into a respective prior operating mode (which may happen to be the idle mode 405, but which may also be a lower level power down mode).

To support cancellation commands, a memory device may maintain state information (one or more state variables) indicating the respective state of different entities at different hierarchical levels within the memory device. The memory device may maintain the state information in one or more registers (e.g., mode registers, status registers, or other registers) and may update the state information as commands are received for the different entities. When the memory device receives a cancellation command for a target entity, the memory device may consult the state information to determine the respective prior operating modes of any lower level entities within the target entity. Table 1 shows examples of state variables and thus state information for different entities at different hierarchical levels within the memory device:

TABLE 1

| Die X Mode | Bank Group X Mode | Bank X Mode | Die X State Variables | Bank Group X State Variables | Bank X State Variables |
|---|---|---|---|---|---|
| Idle | Idle | Idle | 00 | 0 | 00 |
| Idle | Idle | Bank PD-1 | 00 | 0 | 01 |
| Idle | Idle | Bank PD-2 | 00 | 0 | 10 |
| Idle | Bank Group PD-1 | Bank PD-2 | 00 | 1 | — |
| Die PD-1 | Band Group PD-1 | Bank PD-2 | 01 | — | — |
| Die PD-2 | Bank Group PD-1 | Bank PD-2 | 10 | — | — |

For each hierarchical level, the memory device may use an encoding scheme to assign a unique combination of state variables to each low power mode at that hierarchical level along with the idle mode for that hierarchical level. For example, at the bank level, the memory base may assign a first logic value (00) to the idle mode 405, a second logic value (01) to the first bank level low power mode 410-*a*, and a third logic value (10) to the second bank level low power mode 410-*b*. As another example, for the group level, the memory device may assign a first logic value (0) to the idle mode 405 and a second logic value (1) to the group level low power mode 415. As yet another example, for the die level, the memory device may assign a first logic value (00) to the idle mode 405, a second logic value (01) to the first die level low power mode 420-*a*, and a third logic value (10) to the second die level low power mode 420-*b*.

In some cases, the memory device may assign a priority to each hierarchical level. For example, the memory device may prioritize the state information for a higher hierarchical level over the state information for a lower hierarchical level—e.g., the state information for a memory die 305 may be prioritized over the state information for a bank group 310 within the memory die, which may in turn be prioritized over the state information for a memory bank 320 within the bank group 310. The memory device may determine the operating mode of an entity within the memory device based on the state information (state variables) for the entity along with the state information for any higher level entity that includes (takes priority over) the entity. Further, because the memory device may update (e.g., overwrite) the state information for the entity in response to receiving a command relevant to the entity, the memory device may prioritize commands for different hierarchical levels according to the priorities assigned to the state information for the different hierarchical levels.

Table 1 provides an illustrative example of how a memory device may utilize state information to manage the operating modes of different entities at different hierarchical levels. Table 1 illustrates the state information for one memory die 305, for one bank group 310 X within the memory die 305 X, and for one memory bank 320 X within the bank group 310 X, but it is to be understood that the memory device may include and maintain state information for any number of memory dies 305, bank groups 310, memory banks 320, or other entities at any number of hierarchical levels.

When the state variables for the memory die 305 X are (10), the memory device may determine that the memory die 305 X is in the second die level low power mode 420-*b*.

Thus, the memory device may operate the memory die 305 X in the second die level low power mode 420-*b* and may operate all entities within the memory die 305 X in their respective deepest supported low power mode, regardless of their state variables (as indicated the "-" in Table 1, which may indicate a "don't care"). Thus, the memory device may operate the bank group 310 X in the group level low power mode 415 and the memory bank 320 X in the second bank low power mode 410-*b*.

When the state variables for the memory die 305 X are (01), the memory device may determine that the memory die 305 X is in the first die level low power mode 420-*a*. Thus, the memory device may operate the memory die 305 X in the first die level low power mode 420-*a* and may operate all entities within the memory die 305 X in their respective deepest supported low power mode, regardless of their state variables. Thus, the memory device may operate the bank group 310 X in the group level low power mode 415 and the memory bank 320 X in the second bank low power mode 410-*b*.

In general, when an entity at a higher hierarchical level is in a low power mode, the memory device may operate any entity therein that is at a lower hierarchical level according to a low power mode supported by the lower level entity. In some cases (e.g., to maximize power savings), the entity therein at the lower hierarchical level may be operated according to a deepest low power mode supported by the lower level entity. In other cases (e.g., to minimize wakeup time), the entity therein at the lower hierarchical level may be operated according to the power mode supported by the lower level entity that has the quickest wakeup time (e.g., a shallowest low power mode supported by the lower level entity). It is to be understood that the low power mode that the lower level entity is to enter based on the higher level entity being powered down may be any low power mode supported by the lower level entity and further may be statically or dynamically configured.

When the state variables for the memory die 305 X are (00), the memory device may determine that the memory die 305 X is in the idle mode 405 (e.g., all circuitry in the corresponding set of die level circuitry 307 activated). Thus, the memory device may operate the memory die 305 X in the idle mode 405 and may evaluate the group level state information for the bank groups 310 within the memory die 305 X. Thus, in general, when an entity at a higher hierarchical level is in the idle mode, the state information for the entity may not impact how the memory device operates the lower level entities therein.

When the state variables for the memory die 305 X are (00), and the state variable for the bank group 310 X is (1), the memory device may determine that the memory die 305 X is in the idle mode 405 and the bank group 310 X is in the group level low power mode 415. Thus, the memory device may operate the bank group 310 X in the group level low power mode 415 and may operate all entities within the bank group 310 X in their respective deepest supported low power mode, regardless of their state variables. Thus, the memory device may operate the memory bank 320 X in the second bank low power mode 410-*b*.

When the state variables for the memory die 305 X are (00), and the state variable for the bank group 310 X is (0), the memory device may determine that the memory die 305 X and the bank group 310 X are both in the idle mode 405 (e.g., all circuitry in the corresponding set of die level circuitry 307 and the corresponding set of group level circuitry 315 activated). Thus, the memory device may operate the memory bank 320 X according to the state variables for the memory bank 320 X—in the second bank level low power mode 410-*b* if the state variables for the memory bank 320 X are (10), in the first bank level low power mode 410-*a* if the state variables for the memory bank 320 X are (01), and in the idle mode 405 if the state variables for the memory bank 320 X are (00). Thus, in general, when all relevant entities at a higher hierarchical level are in the idle mode, the memory device may operate a lower level entity therein according to the operating mode indicated by the state information for the lower level entity.

When the memory device receives a power down command to place an entity X into operating mode Y (e.g., an EnterPowerDownYDieX command, an EnterPowerDownYBankGroupX command, or an EnterPowerDownYBankX command), the memory device may update the state information stored by the entity X to reflect the state variable(s) associated with the operating mode Y and may operate the memory device and the entities therein based on the corresponding state information.

In some cases, when the memory device receives a cancellation command for an entity X, the memory device may switch the entity X into the idle mode 405 (e.g., may activate circuitry for the entity X at the corresponding hierarchical level), may consult the state information for any lower level entities win the entity X, and may operate such lower level entities according to their respective state information. If the memory device maintains lower level state information unchanged in response to power down commands for higher level entities, then the state information for such lower level entities will reflect the respective operating modes of such lower level entities as of the time the most recent power down command for the entity X was received. Thus, by operating such lower level entities according to their respective state information, the memory device will operate such lower level entities in their respective operating modes as of the time the most recent power down command for the entity X was received.

For example, with reference to FIG. 5, when a cancellation command is received for the bank group 310 X, the memory device may activate the corresponding set of group level circuitry 315 and may switch a memory bank 320 within the bank group 310 X from the second bank level low power mode 410-*b* into the idle mode 405 (as shown by transition 550-*c*), into the first bank level low power mode 410-*a* (as shown by transition 550-*b*), or may maintain the memory bank 320 in the second bank level low power mode 410-*b* (as shown by transition 550-*a*), depending on the state information for the memory bank 320. If different memory banks 320 within the bank group 310 X have different corresponding state variables, then the memory banks 320 may be switched into different bank level operating modes in response to the cancellation command.

As another example, with reference to FIG. 5, when a cancellation command is received for a memory die 305 X when the memory die 305 X is in either the first die level low power mode 420-*a* or the second die level low power mode 420-*b*, the memory device may activate the corresponding set of die level circuitry 307. Also, for any bank group 310 within the memory die 305 X for which the corresponding state variable is (1), the memory device may switch the bank group 310 into the group level low power mode 415 (e.g., may maintain as deactivated the corresponding set of group level circuitry 315, may maintain any memory bank 320 therein in the second bank level low power mode 410-*b*), as shown in transitions 555-*a* and 555-*b*. Alternatively, for any bank group 310 within the memory die 305 X for which the corresponding state variable is (0), the memory device may switch a memory bank 320 within the bank group 310 X from the second bank level low power mode 410-*b* into the idle mode 405 (as shown by transitions 550-*d* and 550-*f*), into the first bank level low power mode 410-*a* (as shown by transitions 550-*e* and 550-*f*), or may maintain the memory bank 320 in the second bank level low power mode 410-*b* (as shown by transitions 550-*c* and 555-*f*), depending on the state information for the memory bank 320.

Thus, in response to a cancelation (remove) command, a memory device may be conceptualized as removing the device from one or more higher hierarchical level low power modes, such that lower level entities with the memory device are operated according to their respective prior operating modes. The effect of the cancellation (remove) command thus may depend on the state information for each lower level entity within the higher level entity targeted by the command.

Figure 6:
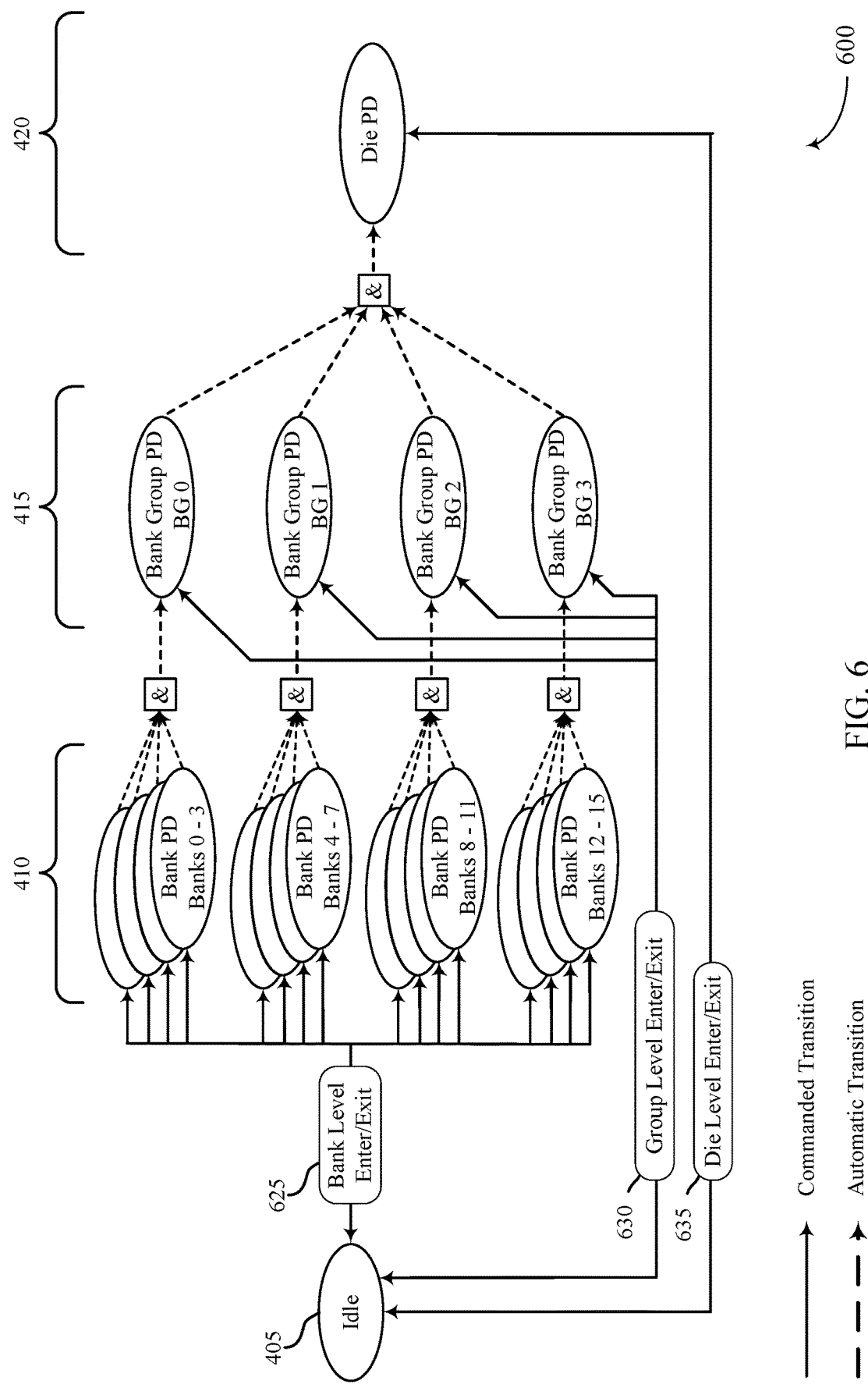
FIG. 6 illustrates an example of a state diagram that supports architecture-based power management for a memory device in accordance with examples as disclosed herein.

FIG. 6 illustrates another example of a state diagram 600 that supports architecture-based power management for a memory device in accordance with examples as disclosed herein. Aspects of the state diagram 600 may be implemented by the memory device 110, memory die 160, memory die 200, memory die architecture 300, state diagram 400 or state diagram 500 described with reference to FIGS. 1-5. The state diagram 600 illustrates examples of a memory device automatically switching an entity at a higher hierarchical level into a low power mode (and thus powering down the device more deeply, into a deeper low power mode from the device perspective) when at least a threshold number (e.g., all) of the lower level entities within the higher level entity are operating (e.g., have been individually switched into) a corresponding low power mode.

For example, a memory device may determine that all the memory banks 320 in a bank group 310 are individually operating in a bank level low power mode 410, and the memory device may automatically (e.g., without receiving an additional, group level command) switch the bank group 310 to a group level low power mode 415 (e.g., may deactivate some or all of the set of group level circuitry 315 for the bank group 310, may transition any memory bank 320 in the bank group 310 that is not already in a deepest bank level low power mode 410 to the deepest bank level low power mode 410).

In FIG. 6, the &-denoted transitions between bank level low power modes 410 and group level low power modes 415 are examples of automatic transitions. The & blocks may represent logical operations and related circuitry (e.g., one or more AND gates, or counter and comparator circuitry) configured to initiate an automatic transition when a threshold quantity (e.g., all) of the memory banks 320 in a bank group 310 are individually operating in a bank level low power mode 410.

As another example, a memory device may determine that all the bank groups 310 in a memory die 305 are individually operating in a group level low power mode 415, and the memory device may automatically (e.g., without receiving an additional, die level command) switch the memory die 305 to a die level low power mode 420 (e.g., may deactivate some or all of the set of die level circuitry 307 for the memory die 305, may transition any bank group 310 in the memory die 305 that is not already in a deepest group level low power mode 415 to the deepest group level low power mode 415). In FIG. 6, the &-denoted transitions between group level low power modes 415 and die level low power mode 420 are examples of such transitions.

As shown in FIG. 6, individual memory banks 320 may transition between the idle mode 405 and one or more supported bank level low power modes 410 in response to bank level power down and power up (enter/exit) commands 625. Similarly, individual bank groups may transition between the idle mode 405 and one or more supported group level low power modes 415 in response to group level power down and power up (enter/exit) commands 630, and an individual memory die 305 may transition between the idle mode 405 and one or more supported die level low power modes 420 in response to die level power down and power up (enter/exit) commands 635. Thus, in general, power down and power up commands may be received for individual entities at any hierarchical level, which may cause entities at that hierarchical level along with related entities at lower or higher hierarchical levels to transition between operating modes, as described with reference to FIG. 4, for example. Additionally, automatic transitions may occur for a higher level entity based on all lower level entities therein being in a low power mode.

In some cases, a memory device may support higher level low power modes but need not support higher level power down and power up commands. For example, a memory device may support bank level enter/exit commands 625, but not group level enter/exit commands 630 or die level enter/exit commands 635. In such a case, the memory device may nevertheless support group level low power modes 415, and a bank group may be switched into a group level low power mode 415 based on receiving bank level power down (enter) commands 625 for all memory banks 320 of the bank group 310. Similarly, the memory device may nevertheless support die level low power modes 420, and the memory die 305 may be switched into a die level low power mode 420 based on receiving bank level power down (enter) commands 625 for all memory banks 320 in all bank groups 310 of the memory die 305. Higher level entities may subsequently be activated (switched into the idle mode 405) based on receiving power up commands for a lower level entity therein.

Some memory devices may support automatic transitions (e.g., as described with reference to FIG. 6) along with cancellation (remove) commands as described herein. In such cases, a cancellation command may have no impact on (e.g., may not undo) any transition that occurred automatically. For example, if a bank group 310 is switched into a group level low power mode 415, then a subsequently received cancellation command for the bank group 310 may have no impact, and the bank group 310 may be maintained in the group level low power mode 415 (the memory banks 320 in the bank group 310 may also each be maintained in a bank level low power mode 410).

In some cases, to support distinguishing between low power modes entered into via automatic transitions versus commanded transitions (e.g., to support removing only commanded transitions in response to cancellation commands), a memory device may maintain additional state information (e.g., additional state variables) to store an indication not only of the current operating mode of an entity but also whether the current operating mode was entered into via a commanded transition or an automatic transition. The memory device may store the state information in one or more registers (e.g., mode registers, status registers) or other storage. Table 2 may represent an example of such state information:

| Die X Mode | Bank Group X Mode | Bank X Mode | Die X State Variables | Bank Group X State Variables | Bank X State Variable |
|---|---|---|---|---|---|
| Idle | Idle | Idle | 00 | 00 | 0 |
| Idle | Idle | Bank PD | 00 | 00 | 1 |
| Idle | Bank Group PD | Bank PD | 00 | 01 | — |
| Idle | Automatic Bank Group PD | Bank PD | 00 | 1– | 1 |
| Die PD | Bank Group PD | Bank PD | 01 | 01 | — |
| Die PD | Automatic Bank Group PD | Bank PD | 01 | 1– | 1 |
| Automatic Die PD | Bank Group PD | Bank PD | 1– | 01 | — |
| Automatic Die PD | Automatic Bank Group PD | Bank PD | 1– | 1– | 1 |

The example of Table 2 may be for a memory device that supports one bank level low power mode 410, one group level low power mode 415, and one die level low power mode 420. For each entity (e.g., each memory bank 320, bank group 310, or memory die 305), the memory device may store one operating mode variable that indicates the operating mode of the entity. For example, an operating mode variable of (0) may indicate the idle mode 405 for the entity, and an operating mode variable of (1) may indicate the low power mode for the entity. Where more than one low power mode is supported at the hierarchical level of the entity, the memory device may store more than one operating mode variable to indicate the operating mode of the entity.

For each entity that is not at the lowest hierarchical level (e.g., each bank group 310 or memory die 305), the memory device may also store an additional transition variable to indicate whether the value of the operating mode variable (and thus the operating mode) for the entity is the result of a command or an automatic transition. For example, a transition variable value of (0) may indicate the operating mode for the entity was the result of a command, and a transition variable value of (1) may indicate the operating mode for the entity was the result of an automatic transition.

Table 2 may illustrate state information possibilities for one memory die 305 X, one bank group 310 X within the memory die 305 X, and one memory bank 320 X within the bank group 310 X, along with the resulting operating mode for each entity. In Table 2, for columns with two state variables, the rightmost state variable may be the operating mode variable, and the leftmost state variable may be the transition variable.

A lower level entity may be operated according to its state variables if all corresponding higher level entities are in the idle mode. Thus, for example, when the state variables for the memory die 305 X and the bank group 310 X are all zeroes, then the memory bank 320 X may be in the operating mode indicated by the operating mode variable for the memory bank 320 X.

When a higher level entity is in a commanded low power mode (01), the state variables for lower level entities therein may be maintained, but any lower level entity therein will be in a corresponding low power mode, regardless of the state variable(s) for the lower level entity. Thus, for example, when the state variables for the bank group 310 X are (01), the state variable for the memory bank 320 X is a "–" (don't care) for purposes of determining the operating mode of the memory bank 320 X, though it may be maintained and dictate (be used to determine) an operating mode to which the memory bank 320 X is to transition in the event of a cancellation command for the bank group 310 X.

When a higher level entity is a low power mode due to an automatic transition, then the operating mode variable for that higher level entity may be a "don't care," and the operating mode variable for any lower level entity therein will by definition be associated with a lower power mode for the entity (e.g. the deepest supported low power mode for that entity, if multiple low power modes are supported for the entity). Thus, for example, when the state variables for the memory die 305 X are (1–), the state variables for the bank group 310 X and the memory bank 320 X may respectively be (01) and (1), or may respectively be (11) and (1), and a cancellation command for the memory die 305 X will not alter the operating modes of any of the memory die 305 X, the bank group 310 X, or the memory bank 320 X.

Figure 7:
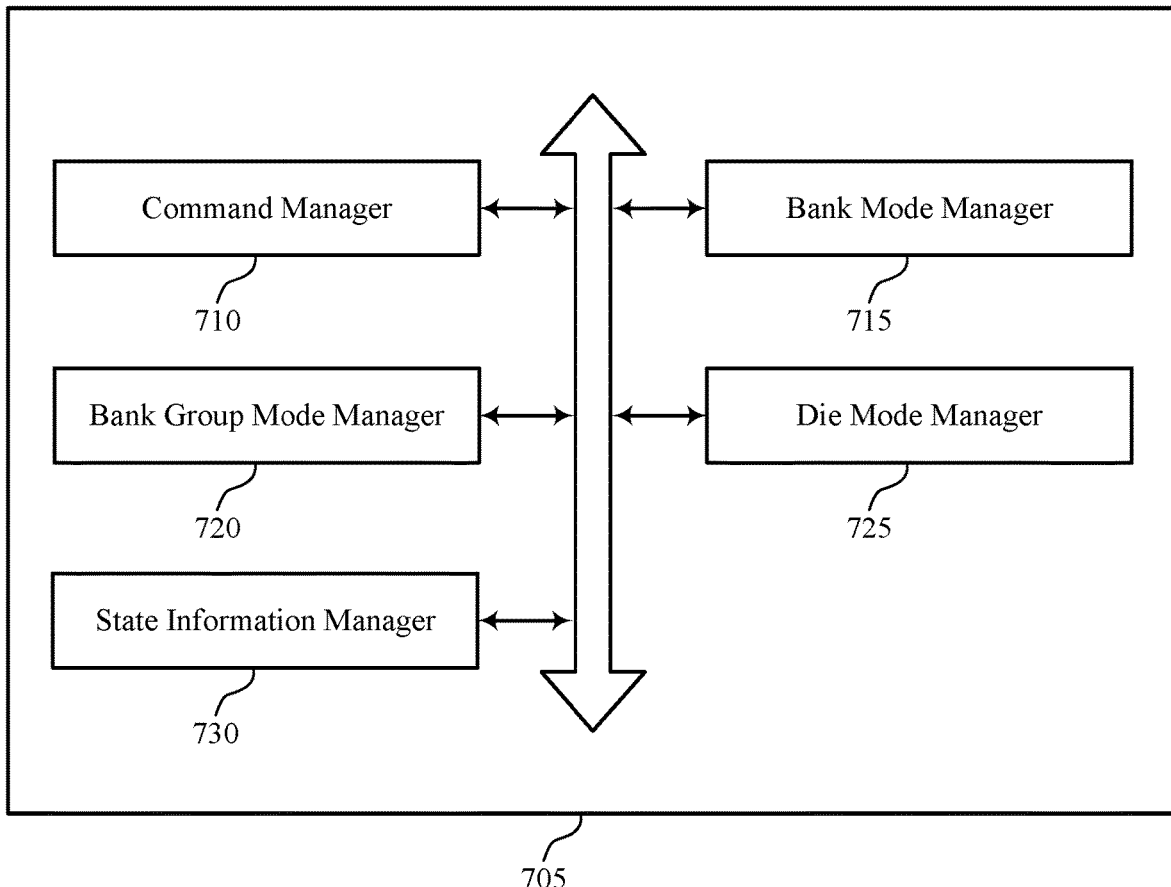
FIG. 7 shows a block diagram of a memory device that supports architecture-based power management for a memory device in accordance with aspects of the present disclosure.

FIG. 7 shows a block diagram 700 of a memory device 705 that supports architecture-based power management for a memory device in accordance with examples as disclosed herein. The memory device 705 may be an example of aspects of a memory device as described with reference to FIGS. 1 through 6. The memory device 705 may include a command manager 710, a bank mode manager 715, a bank group mode manager 720, a die mode manager 725, and a state information manager 730. Each of these modules may communicate, directly or indirectly, with one another (e.g., via one or more buses).

In some examples, the bank mode manager 715 may operate a first memory bank within a memory device in a first mode and a second memory bank within the memory device in a second mode. The command manager 710 may receive, at the memory device while operating a first memory bank in the first mode and the second memory bank in the second mode, a power down command for the first memory bank. The bank mode manager 715 may switch, based on the command manager 710 receiving the power down command for the first memory bank, the first memory bank from the first mode to a first low power mode while maintaining the second memory bank in the second mode, where the first low power mode corresponds to less power consumption by the first memory bank than the first mode.

In some examples, switching the first memory bank from the first mode to the first low power mode may include deactivating circuitry dedicated to the first memory bank.

In some examples, the command manager 710 may receive, at the memory device while operating the first memory bank in the first low power mode, a second power down command for the first memory bank. The bank mode manager 715 may switch, based on the command manager 710 receiving the second power down command for the first memory bank, the first memory bank from the first low power mode to a second low power mode, where the second power mode corresponds to a different amount of power consumption by the first memory bank than the first low power mode.

In some examples, switching the first memory bank from the first low power mode to the second low power mode may include deactivating additional circuitry dedicated to the first memory bank. In some examples, switching the first memory bank from the first low power mode to the second low power mode may include activating a portion of the deactivated circuitry dedicated to the first memory bank.

In some examples, the command manager 710 may receive, at the memory device while operating the first memory bank in the first low power mode, a power up command for the first memory bank. The bank mode manager 715 may switch, based on the command manager 710 receiving the power up command for the first memory bank, the first memory bank from the first low power mode to an idle mode, where the idle mode corresponds to more power consumption by the first memory bank than the first low power mode. The bank group mode manager 720 may activate, based on the command manager 710 receiving the power up command for the first memory bank, circuitry shared by the first memory bank and at least one other memory bank of the memory device.

In some examples, the bank group mode manager 720 may operate a first group of memory banks within a memory device in a first mode and a second group of memory banks within the memory device in a second mode, where a first set of circuitry is shared by memory banks of the first group and a second set of circuitry is shared by memory banks of the second group. The command manager 710 may receive, at the memory device while operating the first group of memory banks in the first mode and the second group of memory banks in the second mode, a power down command for the first group of memory banks. The bank group mode manager 720 may deactivate, based on the command manager 710 receiving the power down command for the first group of memory banks, the first set of circuitry while the bank mode manager 715 may maintain the second group of memory banks in the second mode.

In some examples, each memory bank of the first group of memory banks supports a set of one or more low power modes, and the bank mode manager 715 may switch each memory bank of the first group into a first low power mode of the set based on the command manager 710 receiving the power down command for the first group of memory banks. In some examples, each low power mode of the set corresponds to a respective power consumption level, and the first low power mode corresponds to a lower power consumption level than each other low power mode of the set.

In some examples, switching each memory bank of the first group into the first low power mode may include deactivating a respective set of dedicated circuitry for each memory bank of the first group.

In some examples, the command manager 710 may receive, after deactivating the first set of circuitry, a power up command for a first memory bank of the first group. The bank group mode manager 720 may activate the first set of circuitry based on the command manager 710 receiving the power up command for the first memory bank. The bank mode manager 715 may switch, based on the command manager 710 receiving the power up command for the first memory bank, the first memory bank into an idle mode while maintaining a second memory bank of the first group in the first low power mode.

In some examples, the command manager 710 may receive, after deactivating the first set of circuitry, a power up command for the first group of memory banks. The bank group mode manager 720 may activate the first set of circuitry based on the command manager 710 receiving the power up command for the first group of memory banks. The bank mode manager 715 may switch, based on the command manager 710 receiving the power up command for the first memory group of memory banks, each memory bank of the first group into an idle mode.

In some examples, the die mode manager 725 may activate, based on the command manager 710 receiving the power up command for the first group of memory banks, a third set of circuitry that is shared by memory banks of the first group and memory banks of the second group.

In some examples, the command manager 710 may receive, after deactivating the first set of circuitry, a power up command for a memory die that includes the first group of memory banks and the second group of memory banks. The bank group mode manager 720 may activate the first set of circuitry and the second set of circuitry based on the command manager 710 receiving the power up command for the memory die. The die mode manager 725 may activate, based on the command manager 710 receiving the power up command for the memory die, a third set of circuitry that is shared by memory banks of the first group and memory banks of the second group. The bank mode manager 715 may switch, based on the command manager 710 receiving the power up command for the memory die, each memory bank of the first group and each memory bank of the second group into an idle mode.

In some examples, the state information manager 730 may store and update, based on the command manager 710 receiving the power down command for the first group of memory banks, state variables indicating a respective mode of operation for each memory bank of the first group. The command manager 710 may receive, after deactivating the first set of circuitry, a cancellation command for the first group of memory banks, the cancellation command to reverse the power down command for the first group of memory banks. The bank mode manager 715 may access the stored state variables based on the command manager 710 receiving the cancellation command, and the bank mode manager 715 may switch, based on accessing the stored state variables, each memory bank of the first group into the respective mode of operation.

In some examples, the bank group mode manager 720 may activate the first set of circuitry based on the command manager 710 receiving the cancellation command. In some examples, the die mode manager 725 may activate, based on the command manager 710 receiving the cancellation command, a third set of circuitry that is shared by memory banks of the first group and memory banks of the second group.

In some examples, the bank group mode manager 720 may operate a first group of memory banks in respective first modes and a second group of memory banks in respective second modes, the first group of memory banks and the second group of memory banks both included in a memory die. The command manager 710 may receive, while operating the first group of memory banks in the respective first modes and the second group of memory banks in the respective second modes, a power down command for the memory die. The bank mode manager 715 may switch, based on the command manager 710 receiving the power down command for the memory die, each memory bank of the first group and each memory bank of the second group into a low power mode corresponding to a lower power consumption level than at least one of the respective first modes or respective second modes. The bank group mode manager 720 may deactivate, based on the command manager 710 receiving the power down command for the memory die, a set of circuitry shared by the first group of memory banks and the second group of memory banks.

In some examples, the command manager 710 may receive, while the set of circuitry shared by the first group of memory banks and the second group of memory banks is deactivated, a power up command for the first group of memory banks. The bank mode manager 715 may switch, based on receiving the power up command for the first group of memory banks, each memory bank of the first group from the low power mode to an idle mode while maintaining each memory bank of the second group in the low power mode. The bank group mode manager 720 may activate, based on receiving the power up command for the first group of memory banks, a second set of circuitry shared by memory banks of the first group while maintaining as deactivated a third set of circuitry shared by memory banks of the second group. The die mode manager 725 may activate, based on receiving the power up command for the first group of memory banks, the set of circuitry shared by the first group of memory banks and the second group of memory banks.

In some examples, the command manager 710 may receive, while the set of circuitry shared by the first group of memory banks and the second group of memory banks is deactivated, a power up command for a first memory bank of the first group of memory banks. The bank mode manager 715 may switch, based on the command manager 710 receiving the power up command for the first memory bank, the first memory bank from the low power mode to an idle mode while maintaining each other memory bank of the first group and each memory bank of the second group in the low power mode. The bank group mode manager 720 may activate, based on the command manager 710 receiving the power up command for the first memory bank, a second set of circuitry shared by memory banks of the first group while maintaining as deactivated a third set of circuitry shared by memory banks of the second group. The die mode manager 725 may activate, based on the command manager 710 receiving the power up command for the first memory bank, the set of circuitry shared by the first group of memory banks and the second group of memory banks.

In some examples, the bank group mode manager 720 may operate a set of circuitry shared by all memory banks within a group of memory banks in a memory device. The bank group mode manager 720 may determine that a quantity of memory banks within the group are operating in a low power mode, where the low power mode is associated with a lower power consumption level than a second mode supported by each memory bank within the group. The bank group mode manager 720 may deactivate, based on determining that the quantity of memory banks within the group are operating in the low power mode, the set of circuitry shared by the group of memory banks.

In some examples, determining that the quantity of memory banks within the group are operating in the low power mode may include determining that all memory banks within the group are operating in the low power mode.

In some examples, the memory device includes a set of groups of memory banks, and the memory device includes for each of the groups of memory banks in the set a respective set of circuitry shared by all memory banks within the group of memory banks. The die mode manager 725 may operate a set of circuitry shared by all memory banks within the set of groups of memory banks. The die mode manager 725 may determine that the respective set of circuitry is deactivated for at least a quantity of groups of memory banks within the set. The die mode manager 725 may deactivate, based on determining that the respective set of circuitry is deactivated for at least the quantity of groups of memory banks within the set, the set of circuitry shared by all memory banks within the set of groups of memory banks. In some examples, determining that the respective set of circuitry is deactivated for at least the quantity of groups of memory banks within the set may include determining that the respective set of circuitry is deactivated for all groups of memory banks within the set.

In some examples, the set of groups of memory banks includes all groups of memory banks included in a memory die within the memory device.

In some examples, the die mode manager 725 may operate a set of circuitry shared by all memory banks within a die of the memory device. The die mode manager 725 may determine that all memory banks within the die are operating in the low power mode. The die mode manager 725 may deactivate, based on determining that all memory banks within the die of the memory device are operating in the low power mode, the set of circuitry shared by all memory banks within the die.

In some examples, operating in the low power mode includes operating in any of a set of low power modes that each correspond to a respective power consumption level that is lower than a power consumption level corresponding to the second mode. In some examples, the second mode includes an idle mode.

In some examples, the state information manager 730 may store an indication that the set of circuitry shared by the group of memory banks was deactivated based on the determining that the quantity of memory banks within the group are operating in the low power mode. The command manager 710 may receive, after deactivating the set of circuitry shared by the group of memory banks, a cancellation command for the group of memory banks, the cancellation command to reverse a prior power down command for the group of memory banks. The die mode manager 725 may access the stored indication based on receiving the cancellation command, and the die mode manager 725 may maintain the set of circuitry shared by the group of memory banks as deactivated based on the stored indication.

Figure 8:
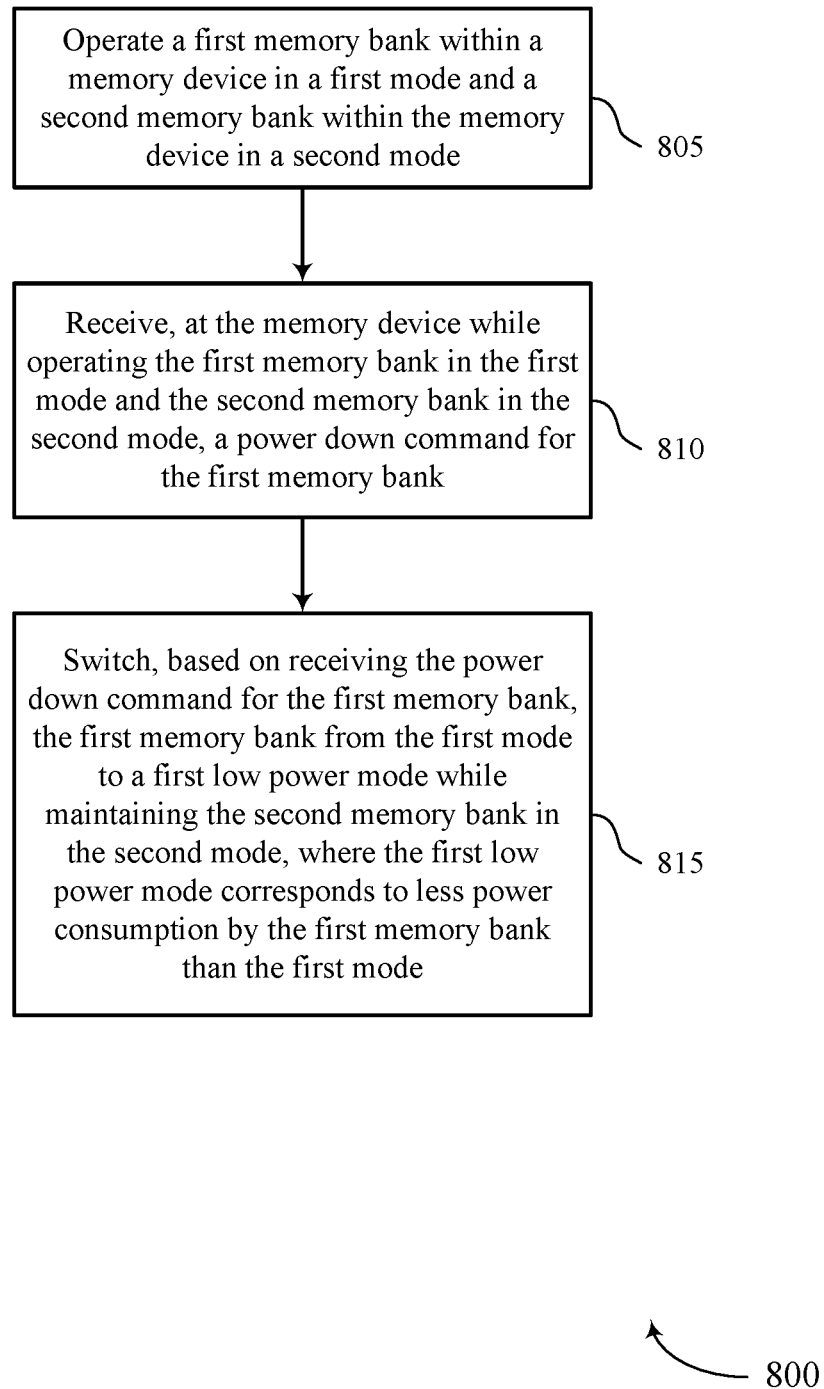
FIGS. 8 through 11 show flowcharts illustrating a method or methods that support architecture-based power management for a memory device in accordance with examples as disclosed herein.

FIG. 8 shows a flowchart illustrating a method or methods 800 that supports architecture-based power management for a memory device in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may operate a first memory bank within a memory device in a first mode and a second memory bank within the memory device in a second mode. The operations of 805 may be performed according to the methods described herein. In some examples, aspects of the operations of 805 may be performed by a bank mode manager as described with reference to FIG. 7.

At 810, the memory device may receive, at the memory device while operating the first memory bank in the first mode and the second memory bank in the second mode, a power down command for the first memory bank. The operations of 810 may be performed according to the methods described herein. In some examples, aspects of the operations of 810 may be performed by a command manager as described with reference to FIG. 7.

At 815, the memory device may switch, based on receiving the power down command for the first memory bank, the first memory bank from the first mode to a first low power mode while maintaining the second memory bank in the second mode, where the first low power mode corresponds to less power consumption by the first memory bank than the first mode. The operations of 815 may be performed according to the methods described herein. In some examples, aspects of the operations of 815 may be performed by a bank mode manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for operating a first memory bank within a memory device in a first mode and a second memory bank within the memory device in a second mode, receiving, at the memory device while operating the first memory bank in the first mode and the second memory bank in the second mode, a power down command for the first memory bank, and switching, based on receiving the power down command for the first memory bank, the first memory bank from the first mode to a first low power mode while maintaining the second memory bank in the second mode, where the first low power mode corresponds to less power consumption by the first memory bank than the first mode.

In some examples of the method 800 and the apparatus described herein, switching the first memory bank from the first mode to the first low power mode may include deactivating circuitry dedicated to the first memory bank.

Some examples of the method 800 and the apparatus described herein may further include operations, features, means, or instructions for receiving, at the memory device while operating the first memory bank in the first low power mode, a second power down command for the first memory bank, and switching, based on receiving the second power down command for the first memory bank, the first memory bank from the first low power mode to a second low power mode, where the second power mode corresponds to a different amount of power consumption by the first memory bank than the first low power mode.

In some examples of the method 800 and the apparatus described herein, switching the first memory bank from the first low power mode to the second low power mode may include deactivating additional circuitry dedicated to the first memory bank, or activating a portion of the deactivated circuitry dedicated to the first memory bank.

Some examples of the method 800 and the apparatus described herein may further include operations, features, means, or instructions for receiving, at the memory device while operating the first memory bank in the first low power mode, a power up command for the first memory bank, and switching, based on receiving the power up command for the first memory bank, the first memory bank from the first low power mode to an idle mode, where the idle mode corresponds to more power consumption by the first memory bank than the first low power mode.

Some examples of the method 800 and the apparatus described herein may further include operations, features, means, or instructions for activating, based on receiving the power up command for the first memory bank, circuitry shared by the first memory bank and at least one other memory bank of the memory device.

Figure 9:
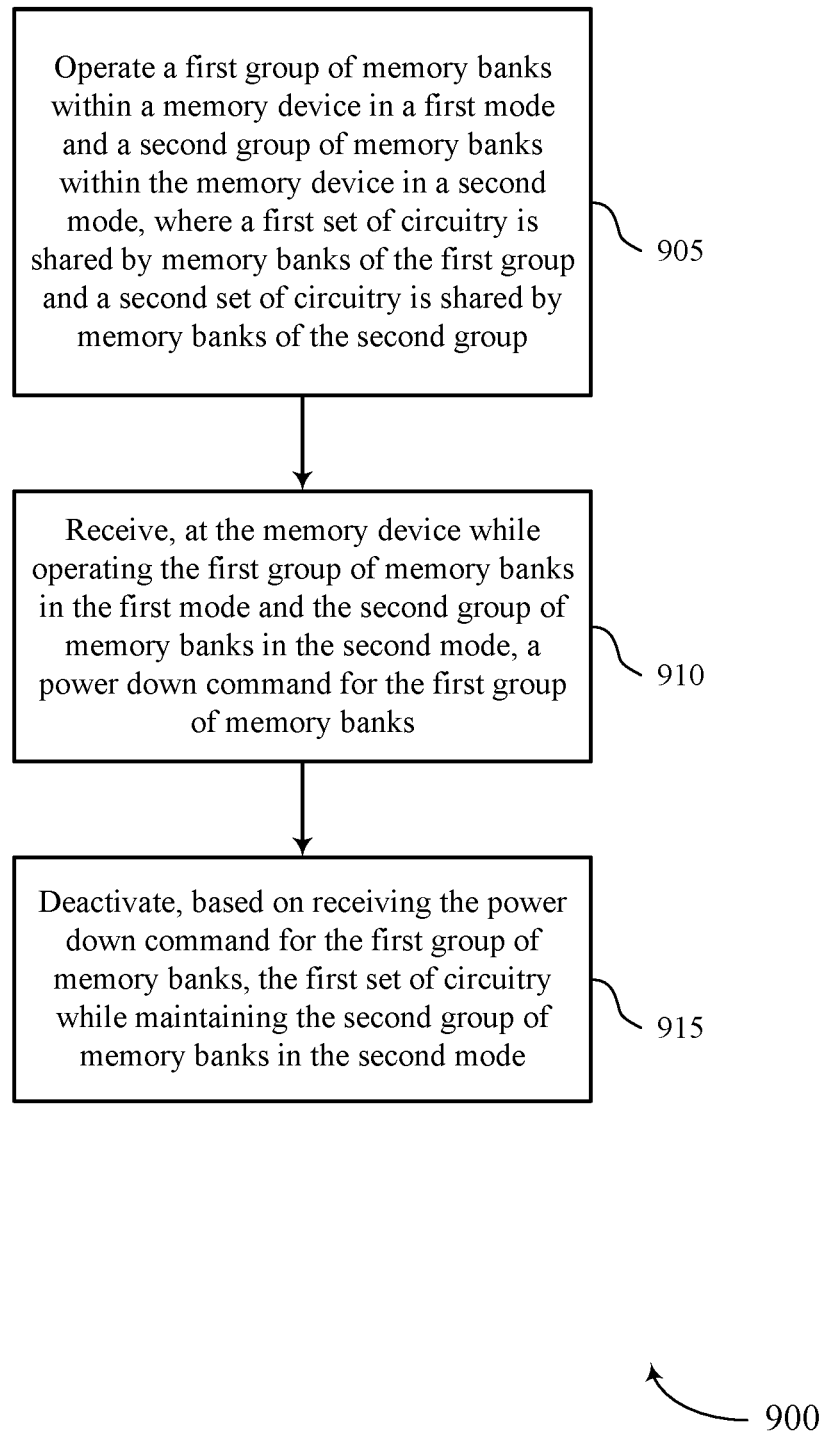

FIG. 9 shows a flowchart illustrating a method or methods 900 that supports architecture-based power management for a memory device in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may operate a first group of memory banks within a memory device in a first mode and a second group of memory banks within the memory device in a second mode, where a first set of circuitry is shared by memory banks of the first group and a second set of circuitry is shared by memory banks of the second group. The operations of 905 may be performed according to the methods described herein. In some examples, aspects of the operations of 905 may be performed by a bank mode manager as described with reference to FIG. 7.

At 910, the memory device may receive, at the memory device while operating the first group of memory banks in the first mode and the second group of memory banks in the second mode, a power down command for the first group of memory banks. The operations of 910 may be performed according to the methods described herein. In some examples, aspects of the operations of 910 may be performed by a command manager as described with reference to FIG. 7.

At 915, the memory device may deactivate, based on receiving the power down command for the first group of memory banks, the first set of circuitry while maintaining the second group of memory banks in the second mode. The operations of 915 may be performed according to the methods described herein. In some examples, aspects of the operations of 915 may be performed by a bank group mode manager or a bank mode manager as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for operating a first group of memory banks within a memory device in a first mode and a second group of memory banks within the memory device in a second mode, where a first set of circuitry is shared by memory banks of the first group and a second set of circuitry is shared by memory banks of the second group, receiving, at the memory device while operating the first group of memory banks in the first mode and the second group of memory banks in the second mode, a power down command for the first group of memory banks, and deactivating, based on receiving the power down command for the first group of memory banks, the first set of circuitry while maintaining the second group of memory banks in the second mode.

In some examples of the method 900 and the apparatus described herein, each memory bank of the first group of memory banks may support a set of one or more low power modes. The method 900 and the apparatus described herein may further include operations, features, means, or instructions for switching each memory bank of the first group into a first low power mode of the set based on receiving the power down command for the first group of memory banks.

In some examples of the method 900 and the apparatus described herein, switching each memory bank of the first group into the first low power mode may include deactivating a respective set of dedicated circuitry for each memory bank of the first group.

In some examples of the method 900 and the apparatus described herein, each low power mode of the set corresponds to a respective power consumption level, and the first low power mode corresponds to a lower power consumption level than each other low power mode of the set.

Some examples of the method 900 and the apparatus described herein may further include operations, features, means, or instructions for receiving, after deactivating the first set of circuitry, a power up command for a first memory bank of the first group, activating the first set of circuitry based on receiving the power up command for the first memory bank, and switching, based on receiving the power up command for the first memory bank, the first memory bank into an idle mode while maintaining a second memory bank of the first group in the first low power mode.

Some examples of the method 900 and the apparatus described herein may further include operations, features, means, or instructions for receiving, after deactivating the first set of circuitry, a power up command for the first group of memory banks, activating the first set of circuitry based on receiving the power up command for the first group of memory banks, and switching, based on receiving the power up command for the first memory group of memory banks, each memory bank of the first group into an idle mode.

Some examples of the method 900 and the apparatus described herein may further include operations, features, means, or instructions for activating, based on receiving the power up command for the first group of memory banks, a third set of circuitry that may be shared by memory banks of the first group and memory banks of the second group.

Some examples of the method 900 and the apparatus described herein may further include operations, features, means, or instructions for receiving, after deactivating the first set of circuitry, a power up command for a memory die that includes the first group of memory banks and the second group of memory banks, activating the first set of circuitry and the second set of circuitry based on receiving the power up command for the memory die, activating, based on receiving the power up command for the first group of memory banks, a third set of circuitry that may be shared by memory banks of the first group and memory banks of the second group, and switching, based on receiving the power up command for the memory die, each memory bank of the first group and each memory bank of the second group into an idle mode.

Some examples of the method 900 and the apparatus described herein may further include operations, features, means, or instructions for storing and updating, based on receiving the power down command for the first group of memory banks, state variables indicating a respective mode of operation for each memory bank of the first group, receiving, after deactivating the first set of circuitry, a cancellation command for the first group of memory banks, the cancellation command to reverse the power down command for the first group of memory banks, accessing the stored state variables based on receiving the cancellation command, and switching, based on accessing the stored state variables, each memory bank of the first group into the respective mode of operation.

Some examples of the method 900 and the apparatus described herein may further include operations, features, means, or instructions for activating the first set of circuitry based on receiving the cancellation command.

Some examples of the method 900 and the apparatus described herein may further include operations, features, means, or instructions for activating, based on receiving the cancellation command, a third set of circuitry that may be shared by memory banks of the first group and memory banks of the second group.

Figure 10:
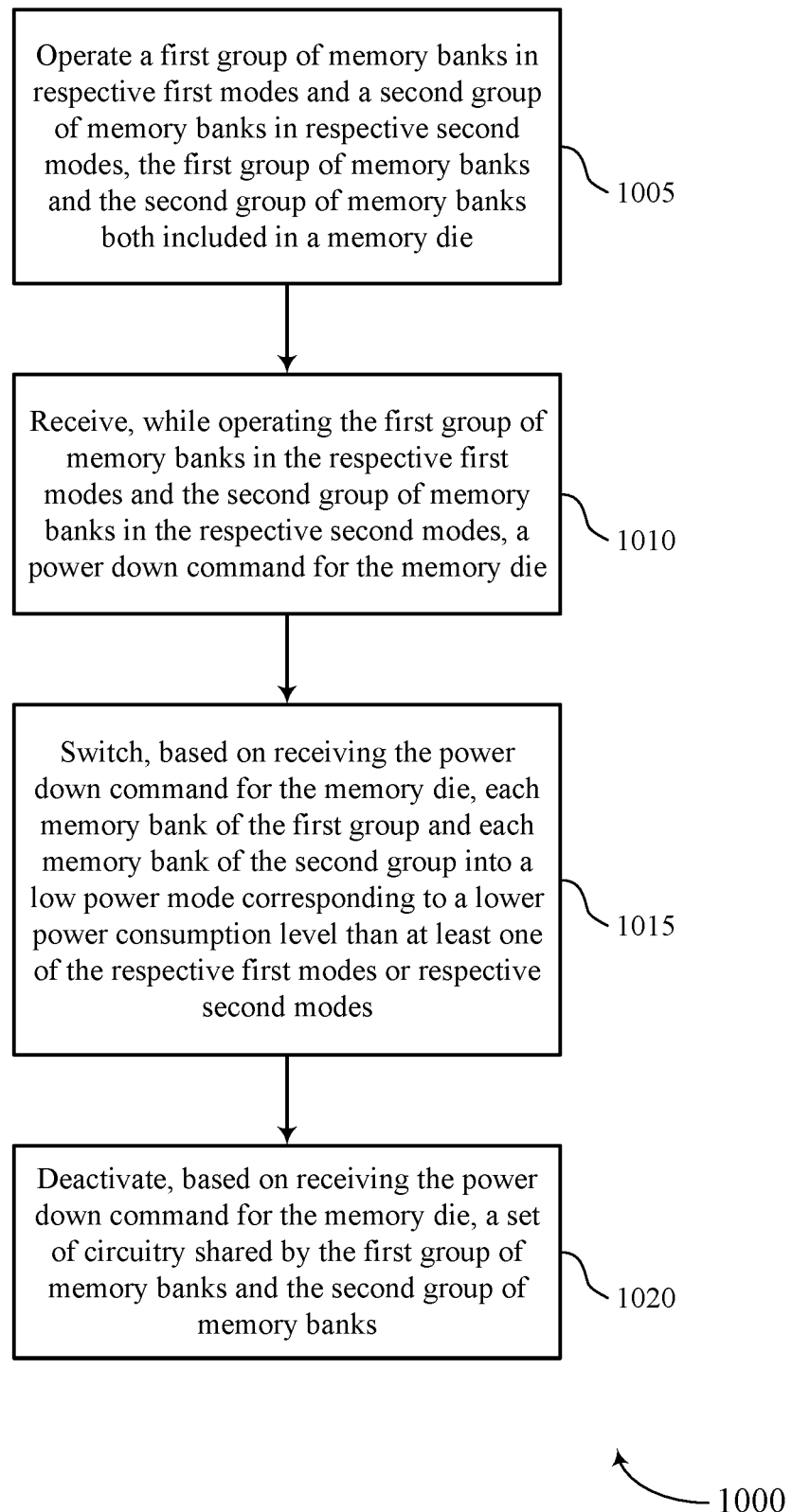

FIG. 10 shows a flowchart illustrating a method or methods 1000 that supports architecture-based power management for a memory device in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may operate a first group of memory banks in respective first modes and a second group of memory banks in respective second modes, the first group of memory banks and the second group of memory banks both included in a memory die. The operations of 1005 may be performed according to the methods described herein. In some examples, aspects of the operations of 1005 may be performed by a bank mode manager as described with reference to FIG. 7.

At 1010, the memory device may receive, while operating the first group of memory banks in the respective first modes and the second group of memory banks in the respective second modes, a power down command for the memory die. The operations of 1010 may be performed according to the methods described herein. In some examples, aspects of the operations of 1010 may be performed by a command manager as described with reference to FIG. 7.

At 1015, the memory device may switch, based on receiving the power down command for the memory die, each memory bank of the first group and each memory bank of the second group into a low power mode corresponding to a lower power consumption level than at least one of the respective first modes or respective second modes. The operations of 1015 may be performed according to the methods described herein. In some examples, aspects of the operations of 1015 may be performed by a bank mode manager as described with reference to FIG. 7.

At 1020, the memory device may deactivate, based on receiving the power down command for the memory die, a set of circuitry shared by the first group of memory banks and the second group of memory banks. The operations of 1020 may be performed according to the methods described herein. In some examples, aspects of the operations of 1020 may be performed by a die mode manager as described with reference to FIG. 7.

In some examples, an apparatus as described herein may perform a method or methods, such as the method 1000. The apparatus may include features, means, or instructions (e.g., a non-transitory computer-readable medium storing instructions executable by a processor) for operating a first group of memory banks in respective first modes and a second group of memory banks in respective second modes, the first group of memory banks and the second group of memory banks both included in a memory die, receiving, while operating the first group of memory banks in the respective first modes and the second group of memory banks in the respective second modes, a power down command for the memory die, switching, based on receiving the power down command for the memory die, each memory bank of the first group and each memory bank of the second group into a low power mode corresponding to a lower power consumption level than at least one of the respective first modes or respective second modes, and deactivating, based on receiving the power down command for the memory die, a set of circuitry shared by the first group of memory banks and the second group of memory banks.

Some examples of the method 1000 and the apparatus described herein may further include operations, features, means, or instructions for receiving, while the set of circuitry shared by the first group of memory banks and the second group of memory banks may be deactivated, a power up command for the first group of memory banks, switching, based on receiving the power up command for the first group of memory banks, each memory bank of the first group from the low power mode to an idle mode while maintaining each memory bank of the second group in the low power mode, activating, based on receiving the power up command for the first group of memory banks, a second set of circuitry shared by memory banks of the first group while maintaining as deactivated a third set of circuitry shared by memory banks of the second group, and activating, based on receiving the power up command for the first group of memory banks, the set of circuitry shared by the first group of memory banks and the second group of memory banks.

Some examples of the method 1000 and the apparatus described herein may further include operations, features, means, or instructions for receiving, while the set of circuitry shared by the first group of memory banks and the second group of memory banks may be deactivated, a power up command for a first memory bank of the first group of memory banks, switching, based on receiving the power up command for the first memory bank, the first memory bank from the low power mode to an idle mode while maintaining each other memory bank of the first group and each memory bank of the second group in the low power mode, activating, based on receiving the power up command for the first memory bank, a second set of circuitry shared by memory banks of the first group while maintaining as deactivated a third set of circuitry shared by memory banks of the second group, and activating, based on receiving the power up command for the first memory bank, the set of circuitry shared by the first group of memory banks and the second group of memory banks.

Figure 11:
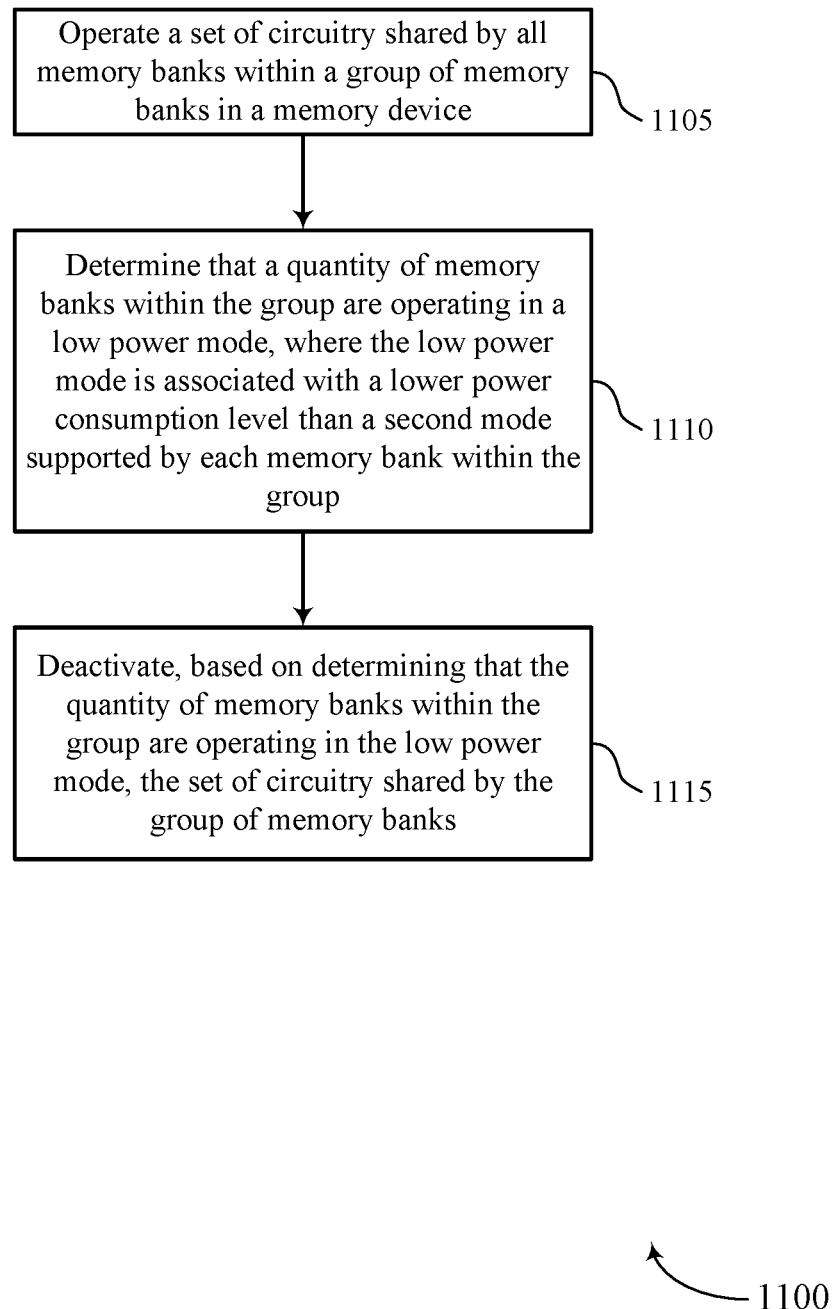

FIG. 11 shows a flowchart illustrating a method or methods 1100 that supports architecture-based power management for a memory device in accordance with aspects of the present disclosure. The operations of method 1100 may be implemented by a memory device or its components as described herein. For example, the operations of method 1100 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1105, the memory device may operate a set of circuitry shared by all memory banks within a group of memory banks in a memory device. The operations of 1105 may be performed according to the methods described herein. In some examples, aspects of the operations of 1105 may be performed by a bank group mode manager as described with reference to FIG. 7.

At 1110, the memory device may determine that a quantity of memory banks within the group are operating in a low power mode, where the low power mode is associated with a lower power consumption level than a second mode supported by each memory bank within the group. The operations of 1110 may be performed according to the methods described herein. In some examples, aspects of the operations of 1110 may be performed by a bank group mode manager as described with reference to FIG. 7.

At 1115, the memory device may deactivate, based on determining that the quantity of memory banks within the group are operating in the low power mode, the set of circuitry shared by the group of memory banks. The operations of 1115 may be performed according to the methods described herein. In some examples, aspects of the operations of 1115 may be performed by a bank group mode manager as described with reference to FIG. 7.

In some examples, an apparatus as described herein may perform a method or methods, such as the method 1100. The apparatus may include features, means, or instructions (e.g., a non-transitory computer-readable medium storing instructions executable by a processor) for operating a set of circuitry shared by all memory banks within a group of memory banks in a memory device, determining that a quantity of memory banks within the group are operating in a low power mode, where the low power mode is associated with a lower power consumption level than a second mode supported by each memory bank within the group, and deactivating, based on determining that the quantity of memory banks within the group are operating in the low power mode, the set of circuitry shared by the group of memory banks.

In some examples of the method 1100 and the apparatus described herein, determining that the quantity of memory banks within the group are operating in the low power mode may include determining that all memory banks within the group are operating in the low power mode.

Some examples of the method 1100 and the apparatus described herein may further include operations, features, means, or instructions for operating a set of circuitry shared by all memory banks within the set of groups of memory banks, determining that the respective set of circuitry is deactivated for at least a quantity of groups of memory banks within the set, and deactivating, based on determining that the respective set of circuitry is deactivated for at least the quantity of groups of memory banks within the set, the set of circuitry shared by all memory banks within the set of groups of memory banks.

In some examples of the method 1100 and the apparatus described herein, determining that the respective set of circuitry is deactivated for at least a quantity of groups of memory banks within the set may include determining that the respective set of circuitry is deactivated for all groups of memory banks within the set.

In some examples of the method 1100 and the apparatus described herein, the set of groups of memory banks includes all groups of memory banks included in a memory die within the memory device.

Some examples of the method 1100 and the apparatus described herein may further include operations, features, means, or instructions for operating a set of circuitry shared by all memory banks within a die of the memory device, determining that all memory banks within the die are operating in the low power mode, and deactivating, based on determining that all memory banks within the die of the memory device are operating in the low power mode, the set of circuitry shared by all memory banks within the die.

In some examples of the method 1100 and the apparatus described herein, operating in the low power mode may include operating in any of a set of low power modes that each correspond to a respective power consumption level that may be lower than a power consumption level corresponding to the second mode.

In some examples of the method 1100 and the apparatus described herein, the second mode is an idle mode.

Some examples of the method 1100 and the apparatus described herein may further include operations, features, means, or instructions for storing an indication that the set of circuitry shared by the group of memory banks was deactivated based on the determining that the quantity of memory banks within the group are operating in the low power mode, receiving, after deactivating the set of circuitry shared by the group of memory banks, a cancellation command for the group of memory banks, the cancellation command to reverse a prior power down command for the group of memory banks, accessing the stored indication based on receiving the cancellation command, and maintaining the set of circuitry shared by the group of memory banks as deactivated based on the stored indication.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory device, which may include a set of memory banks that each support an idle mode and a set of one or more low power modes corresponding to lower power consumption than the idle mode. The apparatus may further include sets of dedicated circuitry each specific to a respective memory bank of the set, sets of shared circuitry each shared by a respective group of memory banks of the set, a controller coupled with the set of memory banks, the sets of dedicated circuitry, and the sets of shared circuitry. The controller may be configured to cause the apparatus to switch a memory bank of the set into a first low power mode of the set after the memory device receives a power down command specific to the memory bank. The controller may be further configured to cause the apparatus to switch all memory banks of a group of memory banks that includes the memory bank into the first low power mode of the set and to deactivate a set of shared circuitry of the set shared by the group of memory banks after the memory device receives a power down command specific to the group of memory banks.

In some examples, the controller may be further configured to cause the apparatus to switch the memory bank into the idle mode after the memory device receives a power up command specific to the memory bank, and to switch all memory banks of the group of memory banks into the idle mode and activate the set of shared circuitry after the memory device receives a power up command specific to the group of memory banks.

In some examples, the controller may be further configured to cause the apparatus to activate the set of shared circuitry after the memory device receives the power up command specific to the memory bank.

Some examples of the apparatus may include a set of one or more registers configured to store indications of respective operating modes for the set of memory banks and indications of respective activation states for the set of sets of shared circuitry. The controller may be further configured to cause the apparatus to, after the memory device receives the power down command specific to the group of memory banks, maintain the indications of respective operating modes and indications of respective activation states in the set of one or more registers. The controller may be further configured to cause the apparatus to, after the memory device receives a cancellation command specific to the group of memory banks, the cancellation command to reverse a prior power down command specific to the group of memory banks, identify the respective operating modes and the respective activation states based at least in part on accessing the set of registers, switch all memory banks of the group of memory banks into the respective operating modes, and operate the plurality of sets of shared circuitry according to the respective activation states In some examples, the controller may be further configured to cause the apparatus to monitor for whether all memory banks of the group of memory banks are in a low power mode of the set, and deactivate the set of shared circuitry shared by the group of memory banks based on identifying that all memory banks of the group of memory banks are in the low power mode.

Some examples may further include a set of one or more registers configured to store a respective indication of whether the set of shared circuitry was deactivated based on identifying that all memory banks of the group of memory banks are in the low power mode, where the controller may be further configured to cause the apparatus to, after the memory device receives a cancellation command specific to the group of memory banks that is to reverse a prior power down command specific to the group of memory banks, identify the respective indication based at least in part on accessing the set of registers, and maintain the set of shared circuitry as deactivated based at least in part on identifying the respective indication.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method by a memory device, comprising:
operating a first memory bank within the memory device in a first mode and a second memory bank within the memory device in a second mode;
receiving, at the memory device, a power down command comprising a first index associated with a plurality of low power modes and a second index associated with one or more memory banks of the memory device, wherein the first index comprises a first value corresponding to a first low power mode of the plurality of low power modes and the second index comprises a second value corresponding to the second memory bank;
switching, based at least in part on the power down command comprising the first index and the second index, the second memory bank from the second mode into the first low power mode of the plurality of low power modes;
receiving, at the memory device, a power up command comprising a third index associated with the one or more memory banks, wherein the third index comprises the second value corresponding to the second memory bank; and
switching, based at least in part on the power up command comprising the third index, the second memory bank from the first low power mode of the plurality of low power modes to the second mode.

2. The method of claim 1, further comprising:
operating a third memory bank within the memory device in the second mode; and
switching, based at least in part on receiving the power down command, the third memory bank from the second mode into the first low power mode.

3. The method of claim 2, further comprising:
switching, based at least in part on receiving the power up command, the third memory bank from the first low power mode to the second mode.

4. The method of claim 1, wherein the first low power mode is associated with less power consumption than the second mode.

5. The method of claim 1, wherein the first mode is associated with greater power consumption than the first low power mode.

6. The method of claim 1, wherein operating the second memory bank in the second mode comprises operating the second memory bank in an idle mode.

7. The method of claim 1, further comprising:
receiving, based at least in part on switching the second memory bank to the first low power mode, a power transition command comprising a fourth index associated with the plurality of low power modes and a fifth index associated with the one or more memory banks of the memory device, wherein the fourth index comprises a third value corresponding to a second low power mode of the plurality of low power modes and the fifth index comprises the second value corresponding to the second memory bank; and
switching, based at least in part on the power transition command comprising the fourth index and the fifth index, the second memory bank from the first low power mode to the second low power mode,
wherein receiving the power up command is based at least in part on switching the second memory bank from the first low power mode to the second low power mode, and wherein switching the second memory bank from the first low power mode to the second mode is based at least in part on switching the second memory bank from the first low power mode to the second low power mode.

8. An apparatus A memory device, comprising:
a first memory bank and a second memory bank; and
one or more controllers coupled with the first memory bank and the second memory bank, wherein the one or more controllers are configured to cause the memory device to:
operate the first memory bank in a first mode and the second memory bank in a second mode;
receive, at the memory device, a power down command comprising a first index associated with a plurality of low power modes and a second index associated with one or more memory banks of the memory device, wherein the first index comprises a first value corresponding to a first low power mode of the plurality of low power modes and the second index comprises a second value corresponding to the second memory bank;
switch, based at least in part on the power down command comprising the first index and the second index, the second memory bank from the second mode into the first low power mode of the plurality of low power modes;
receive, at the memory device, a power up command comprising a third index associated with the one or more memory banks, wherein the third index comprises the second value corresponding to the second memory bank; and
switch, based at least in part on the power up command comprising the third index, the second memory bank from the first low power mode of the plurality of low power modes to the second mode.

9. The memory device of claim 8, wherein the one or more controllers are further configured to cause the memory device to:
operate a third memory bank within the memory device in the second mode; and
switch, based at least in part on receiving the power down command, the third memory bank from the second mode into the first low power mode.

10. The memory device of claim 9, wherein the one or more controllers are further configured to cause the memory device to:
switch, based at least in part on receiving the power up command, the third memory bank from the first low power mode to the second mode.

11. The memory device of claim 8, wherein the first low power mode is associated with less power consumption than the second mode.

12. The memory device of claim 8, wherein the first mode is associated with greater power consumption than the first low power mode.

13. The memory device of claim 8, wherein operating the second memory bank in the second mode comprises operating the second memory bank in an idle mode.

14. The memory device of claim 8, wherein the one or more controllers are further configured to cause the memory device to:
receive, based at least in part on switching the second memory bank to the first low power mode, a power transition command comprising a fourth index associated with the plurality of low power modes and a fifth index associated with the one or more memory banks of the memory device, wherein the fourth index comprises a third value corresponding to a second low power mode of the plurality of low power modes and the fifth index comprises the second value corresponding to the second memory bank; and
switch, based at least in part on the power transition command comprising the fourth index and the fifth index, the second memory bank from the first low power mode to the second low power mode,
wherein receiving the power up command is based at least in part on switching the second memory bank from the first low power mode to the second low power mode, and wherein switching the second memory bank from the first low power mode to the second mode is based at least in part on switching the second memory bank from the first low power mode to the second low power mode.

15. A non-transitory computer-readable medium storing code comprising instructions, which when executed by one or more processors of an electronic device, cause the electronic device to:
operate a first memory bank within a memory device in a first mode and a second memory bank within the memory device in a second mode;
receive, at the memory device, a power down command comprising a first index associated with a plurality of low power modes and a second index associated with one or more memory banks of the memory device, wherein the first index comprises a first value corresponding to a first low power mode of the plurality of low power modes and the second index comprises a second value corresponding to the second memory bank;
switch, based at least in part on the power down command comprising the first index and the second index, the second memory bank from the second mode into the first low power mode of the plurality of low power modes;
receive, at the memory device, a power up command comprising a third index associated with the one or more memory banks, wherein the third index comprises the second value corresponding to the second memory bank; and switch, based at least in part on the power up command comprising the third index, the second memory bank from the first low power mode of the plurality of low power modes to the second mode.

16. The non-transitory computer-readable medium of claim 15, wherein the instructions, when executed by the one or more processors of the electronic device, further cause the electronic device to:

operate a third memory bank within the memory device in the second mode; and switch, based at least in part on receiving the power down command, the third memory bank from the second mode into the first low power mode.

17. The non-transitory computer-readable medium of claim 16, wherein the instructions, when executed by the one or more processors of the electronic device, further cause the electronic device to:

switch, based at least in part on receiving the power up command, the third memory bank from the first low power mode to the second mode.

18. The non-transitory computer-readable medium of claim 15, wherein the first low power mode is associated with less power consumption than the second mode.

19. The non-transitory computer-readable medium of claim 15, wherein the first mode is associated with greater power consumption than the first low power mode.

20. The non-transitory computer-readable medium of claim 15, wherein operating the second memory bank in the second mode comprises operating the second memory bank in an idle mode.

* * * * *